(12) United States Patent
Lee et al.

(10) Patent No.: US 12,512,070 B2
(45) Date of Patent: Dec. 30, 2025

(54) DISPLAY DEVICE MINIMIZING EFFECT OF LIGHT-EMITTING ELEMENT

(71) Applicant: Samsung Display Co., LTD., Yongin-si (KR)

(72) Inventors: Se Hyun Lee, Yongin-si (KR); Kwi Hyun Kim, Yongin-si (KR); Jin Joo Ha, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/669,356

(22) Filed: May 20, 2024

(65) Prior Publication Data
US 2025/0061862 A1   Feb. 20, 2025

(30) Foreign Application Priority Data
Aug. 16, 2023  (KR) .................. 10-2023-0106705

(51) Int. Cl.
*G09G 3/3291* (2016.01)
*G02B 27/01* (2006.01)
*G09G 3/3266* (2016.01)
*H10K 59/121* (2023.01)
*H10K 59/131* (2023.01)

(52) U.S. Cl.
CPC ....... *G09G 3/3291* (2013.01); *G02B 27/0172* (2013.01); *G09G 3/3266* (2013.01); *H10K 59/1213* (2023.02); *H10K 59/1216* (2023.02); *H10K 59/131* (2023.02); *G02B 2027/0178* (2013.01); *G09G 2310/08* (2013.01)

(58) Field of Classification Search
None
See application file for complete search history.

(56) References Cited

U.S. PATENT DOCUMENTS

| | | | |
|---|---|---|---|
| 2015/0138253 A1* | 5/2015 | Kimura | G09G 3/3266 345/77 |
| 2019/0019458 A1* | 1/2019 | Teraguchi | H10K 59/123 |
| 2020/0320930 A1* | 10/2020 | Toyotaka | H10K 59/40 |
| 2021/0242292 A1* | 8/2021 | Tsuboi | H10D 30/601 |
| 2024/0404466 A1 | 12/2024 | Lee et al. | |
| 2025/0048859 A1* | 2/2025 | Niu | H10K 59/131 |

FOREIGN PATENT DOCUMENTS

| KR | 102297000 B1 | 9/2021 |
|---|---|---|
| KR | 1020240172347 A | 12/2024 |

* cited by examiner

*Primary Examiner* — Benjamin C Lee
*Assistant Examiner* — Emily J Frank
(74) *Attorney, Agent, or Firm* — CANTOR COLBURN LLP

(57) ABSTRACT

A display device includes a light-emitting element; a first transistor connected between a driving voltage line and an anode electrode of the light-emitting element; a second transistor connected between a data line and a gate electrode of the first transistor; a third transistor connected between a source electrode of the first transistor and the driving voltage line; a fourth transistor connected between a drain electrode of the first transistor and an initialization voltage line; and a first capacitor connected between the gate electrode of the first transistor and a gate electrode of the fourth transistor.

15 Claims, 14 Drawing Sheets

DISPLAY DEVICE MINIMIZING EFFECT OF LIGHT-EMITTING ELEMENT

This application claims priority to Korean Patent Application No. 10-2023-0106705, filed on Aug. 16, 2023, and all the benefits accruing therefrom under 35 U.S.C. § 119, the content of which in its entirety is herein incorporated by reference.

BACKGROUND

1. Field

The disclosure relates to a display device, and more particularly, to a display device in which degradation of image quality may be minimized in spite of deterioration of a light-emitting element.

2. Description of the Related Art

Ahead mounted display ("TIMID") is an image display device that is worn on a user's head in the form of glasses or a helmet and forms a focus at a distance close to user's eyes in front of the user's eyes. The HMD may implement virtual reality ("VR") or augmented reality ("AR").

The HMD magnifies and displays an image displayed by a small display device using a plurality of lenses. Therefore, a display device applied to the HMD needs to provide a high-resolution image, e.g., an image having a resolution of 3000 pixels per inch ("PPI") or more. To this end, an organic light-emitting diode on silicon ("OLEDoS"), which is a small organic light-emitting display device having a high resolution, has been used as the display device applied to the HMD. The OLEDoS is a device that displays an image by disposing organic light-emitting diodes ("OLEDs") on a semiconductor wafer substrate on which a complementary metal oxide semiconductor ("CMOS") is disposed.

SUMMARY

Features of the disclosure provide a display device in which degradation of image quality may be minimized in spite of deterioration of a light-emitting element.

In an embodiment of the disclosure, a display device includes a light-emitting element; a first transistor connected between a driving voltage line and an anode electrode of the light-emitting element; a second transistor connected between a data line and a gate electrode of the first transistor; a third transistor connected between a source electrode of the first transistor and the driving voltage line; a fourth transistor connected between a drain electrode of the first transistor and an initialization voltage line; and a first capacitor connected between the gate electrode of the first transistor and a gate electrode of the fourth transistor.

In an embodiment, the display device may further include a second capacitor connected between the gate electrode of the first transistor and the source electrode of the first transistor.

In an embodiment, the display device may further include a second capacitor connected between the gate electrode of the first transistor and the drain electrode of the first transistor.

In an embodiment, a capacitance of the first capacitor may be greater than a capacitance of the second capacitor, and the capacitance of the second capacitor is greater than a capacitance of the second capacitor.

In an embodiment, the capacitance of the second capacitor may be 31.3% of the capacitance of the second capacitor, and the capacitance of the first capacitor may be 18.8% of the capacitance of the second capacitor.

In an embodiment, the display device may further include a first scan line connected to a gate electrode of the second transistor; an emission control line connected to a gate electrode of the third transistor; and a second scan line connected to the gate electrode of the fourth transistor.

In an embodiment, in an initialization/write period, an emission control signal of the emission control line, a first scan signal of the first scan line, and a second scan signal of the second scan line may each have an active level, in a compensation period, the first scan signal and the second scan signal may each have an active level, in a bypass period, the emission control signal and the second scan signal may each have an active level, and the first scan signal may have a non-active level, and in an emission period, the emission control signal may have an active level, and the first scan signal and the second scan signal may each have a non-active level.

In an embodiment, in the initialization/write period and the compensation period, a previous data voltage may be applied to the data line, in the emission period, a current data voltage may be applied to the data line, and in the bypass period, a transient data voltage transitioning from the previous data voltage to the current data voltage may be applied to the data line.

In an embodiment, at least one of the first transistor, the second transistor, the third transistor, and the fourth transistor may include a body electrode connected to the driving voltage line.

In an embodiment, an initialization voltage of the initialization voltage line may be lower than a driving voltage of the driving voltage line.

In an embodiment, the display device may further include a common voltage line connected to a cathode electrode of the light-emitting element.

In an embodiment, an initialization voltage of the initialization voltage line may be higher than a common voltage of the common voltage line.

In an embodiment of the disclosure, a display device includes a light-emitting element; a first transistor connected between a driving voltage line and an anode electrode of the light-emitting element; a fourth transistor connected between a drain electrode of the first transistor and an initialization voltage line; and a first capacitor connected between a gate electrode of the first transistor and a gate electrode of the fourth transistor.

In an embodiment, the display device may further include a second transistor connected between a data line and the gate electrode of the first transistor; and a third transistor connected between a source electrode of the first transistor and the driving voltage line.

In an embodiment, the display device may further include a second capacitor connected between the gate electrode of the first transistor and the source electrode of the first transistor.

In an embodiment, the display device may further include a third capacitor connected between the gate electrode of the first transistor and the drain electrode of the first transistor.

In an embodiment, a capacitance of the first capacitor may be greater than a capacitance of the third capacitor, and the capacitance of the third capacitor may be greater than a capacitance of the second capacitor.

In an embodiment, the capacitance of the third capacitor may be 31.3% of the capacitance of the second capacitor, and the capacitance of the first capacitor may be 18.8% of the capacitance of the second capacitor.

In an embodiment, the display device may further include a first scan line connected to a gate electrode of the second transistor; an emission control line connected to a gate electrode of the third transistor; and a second scan line connected to the gate electrode of the fourth transistor.

In an embodiment, in an initialization/write period, an emission control signal of the emission control line, a first scan signal of the first scan line, and a second scan signal of the second scan line may each have an active level, in a compensation period, the first scan signal and the second scan signal may each have an active level, in a bypass period, the emission control signal and the second scan signal may each have an active level, and the first scan signal may have a non-active level, and in an emission period, the emission control signal may have an active level, and the first scan signal and the second scan signal may each have a non-active level.

In an embodiment, in the initialization/write period and the compensation period, a previous data voltage may be applied to the data line, in the emission period, a current data voltage may be applied to the data line, and in the bypass period, a transient data voltage which transitions from the previous data voltage to the current data voltage may be applied to the data line.

In an embodiment, at least one of the first transistor, the second transistor, the third transistor, and the fourth transistor may include a body electrode connected to the driving voltage line.

With a display device according to the disclosure, even though a light-emitting element deteriorates, a change rate of a gate voltage of a first transistor is reduced by a first capacitor, and thus, a luminance reduction amount may be minimized. Accordingly, despite deterioration of the light-emitting element, degradation of image quality of the display device may be minimized.

The effects of the disclosure are not limited to the above-described effects and other effects which are not described herein will become apparent to those skilled in the art from the following description.

BRIEF DESCRIPTION OF THE DRAWINGS

The above and other advantages and features of the disclosure will become more apparent by describing in detail embodiments thereof with reference to the attached drawings, in which.

DETAILED DESCRIPTION

Figure 1:
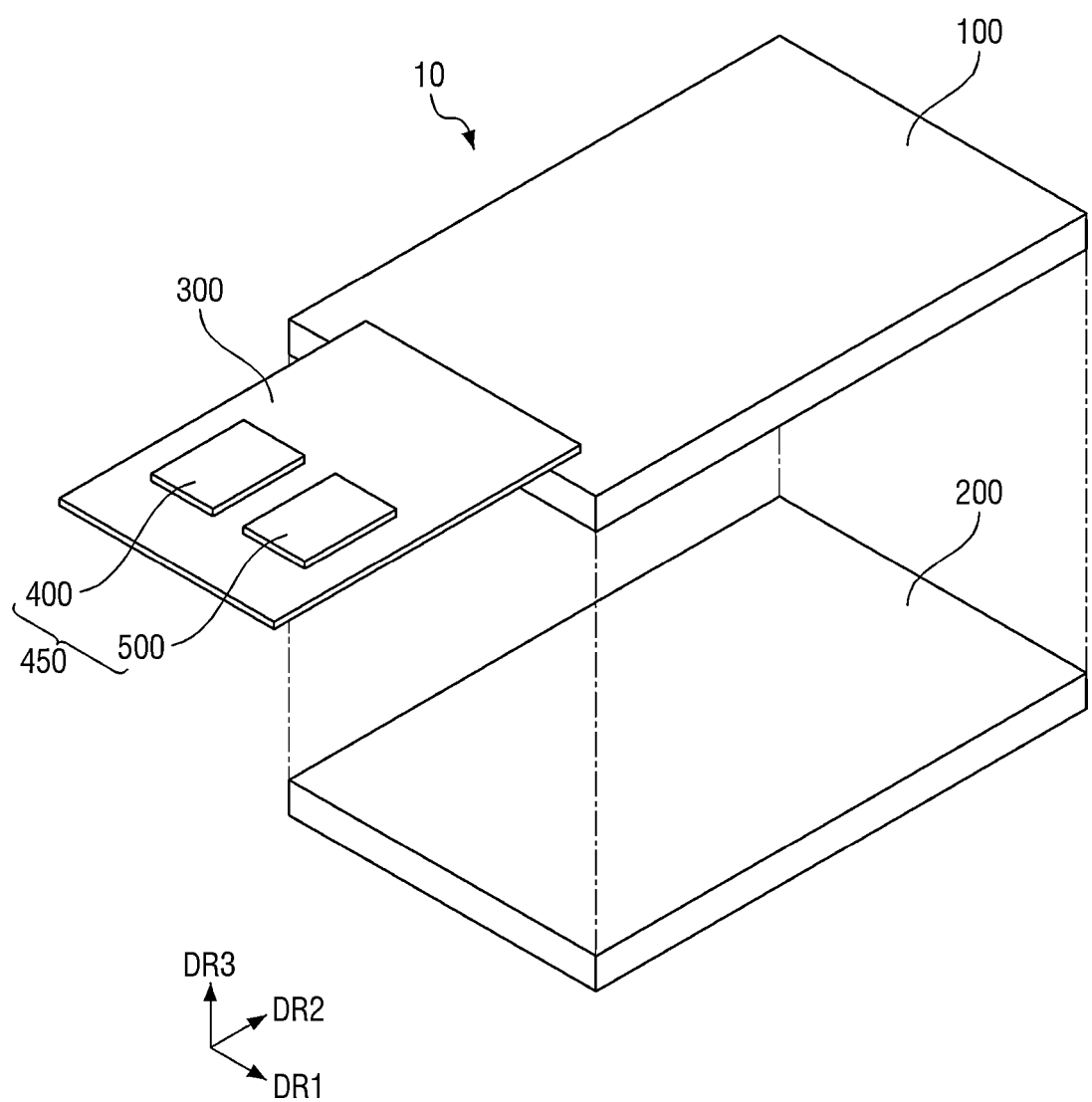
FIG. 1 is an exploded perspective view illustrating an embodiment of a display device.

Embodiments of the disclosure will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification. In the attached drawing figures, the thickness of layers and regions is exaggerated for clarity.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Features of various embodiments of the disclosure may be combined partially or totally. As will be clearly appreciated by those skilled in the art, technically various interactions and operations are possible. Various embodiments may be practiced individually or in combination.

Hereinafter, predetermined embodiments will be described with reference to the accompanying drawings.

Figure 2:
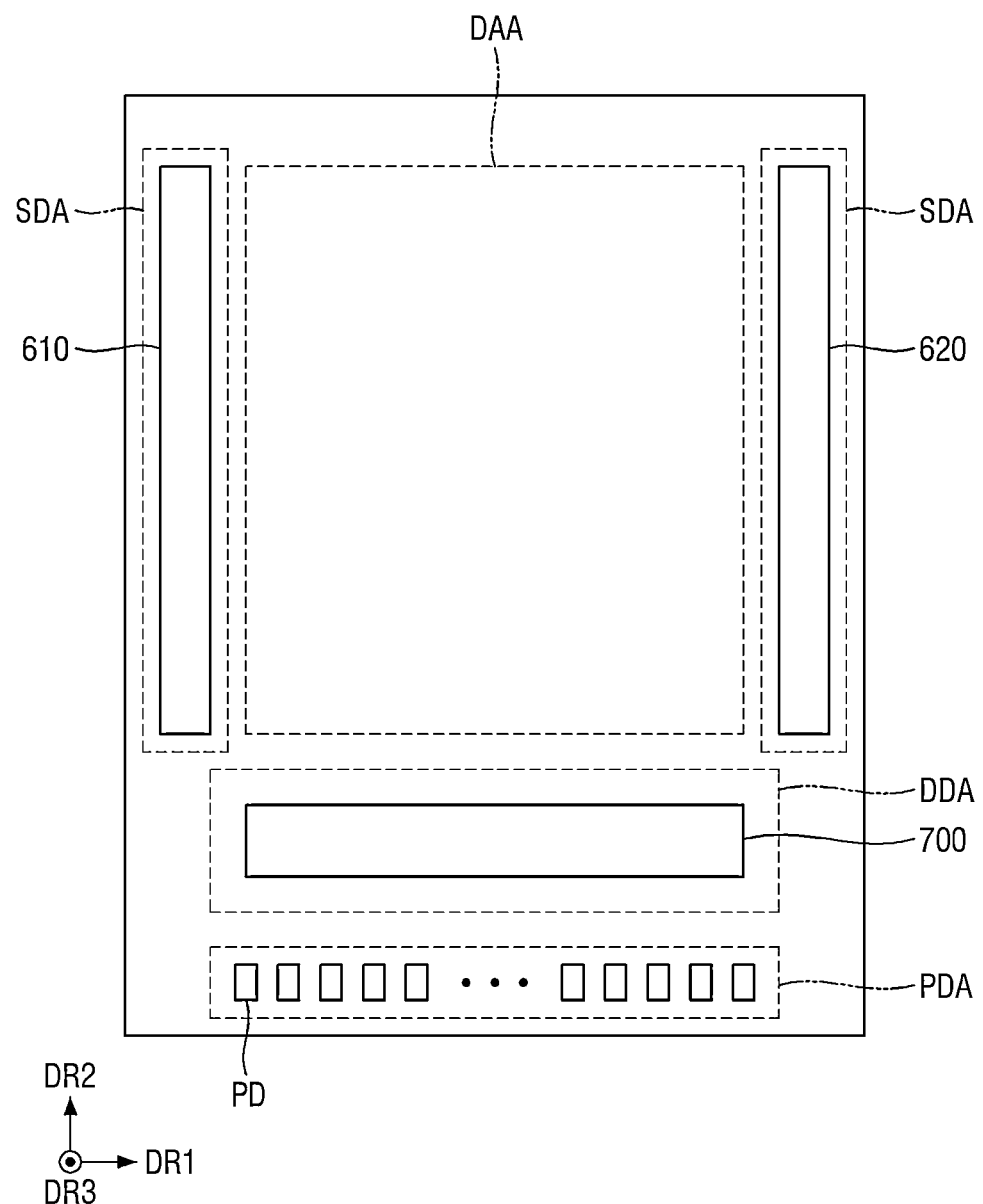
FIG. 2 is a layout diagram illustrating an embodiment of a display panel illustrated in FIG. 1.
Figure 3:
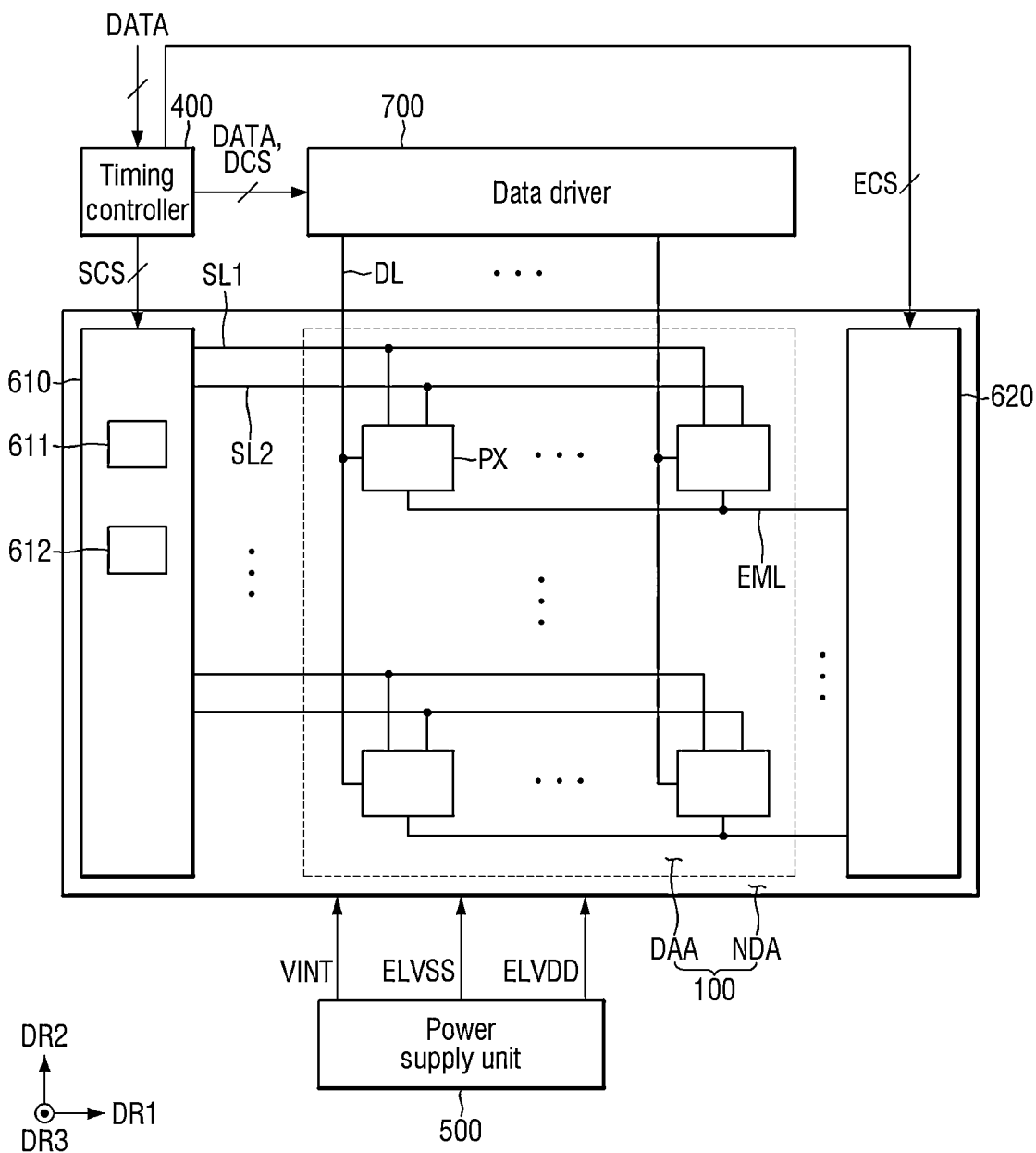
FIG. 3 is a block diagram illustrating an embodiment of the display device.

FIG. 1 is an exploded perspective view illustrating an embodiment of a display device. FIG. 2 is a layout diagram illustrating an embodiment of a display panel illustrated in FIG. 1. FIG. 3 is a block diagram illustrating an embodiment of the display device.

Referring to FIGS. 1 and 2, a display device 10 in an embodiment is a device that displays a moving image or a still image. The display device 10 in an embodiment may be applied to portable electronic devices such as mobile phones, smartphones, tablet personal computers, mobile communication terminals, electronic notebooks, electronic books, portable multimedia players ("PMPs"), navigation devices, and ultra mobile personal computers ("UMPCs"). In an embodiment, the display device 10 may be applied as a display unit of televisions, laptop computers, monitors, billboards, or the Internet of Things ("IOTs"). In an alternative embodiment, the display device 10 may be applied to smart watches, watch phones, or head mounted displays ("HMIDs") for realizing virtual reality and augmented reality.

The display device 10 in an embodiment includes a display panel 100, a heat dissipation layer 200, a circuit board 300, and a driving circuit 450.

The display panel 100 may have a shape similar to a quadrangular shape, e.g., rectangular shape in a plan view. In an embodiment, the display panel 100 may have a shape similar to a quadrangular shape, e.g., rectangular shape, in a plan view, having short sides in a first direction DR1 and long sides in a second direction DR2 crossing the first direction DR1. In the display panel 100, a corner where the short side in the first direction DR1 and the long side in the second direction DR2 meet may be rounded with a predetermined curvature or right-angled, for example. The shape of the display panel 100 in a plan view is not limited to the quadrangular shape, e.g., rectangular shape, and may be a shape similar to other polygonal shapes, a circular shape, or an elliptical shape. A shape of the display device 10 in a plan view may follow the shape of the display panel 100 in a plan view, but the disclosure is not limited thereto.

The display panel 100 may include a display area DAA that displays an image and a non-display area NDA that does not display an image, as illustrated in FIG. 2.

The display area DAA includes a plurality of pixels PX, a plurality of scan lines, a plurality of emission control lines, and a plurality of data lines.

Each of the plurality of pixels PX includes a light-emitting element emitting light. The plurality of pixels PX may be arranged in a matrix form in the first direction DR1 and the second direction DR2. The plurality of scan lines and the plurality of emission control lines may extend in the first direction DR1 and may be disposed in the second direction DR2. The plurality of data lines DL may extend in the second direction DR2 and may be disposed in the first direction DR1.

The plurality of scan lines includes a plurality of first scan lines and a plurality of second scan lines. The plurality of emission control lines includes a plurality of first emission control lines and a plurality of second emission control lines.

Figure 5:
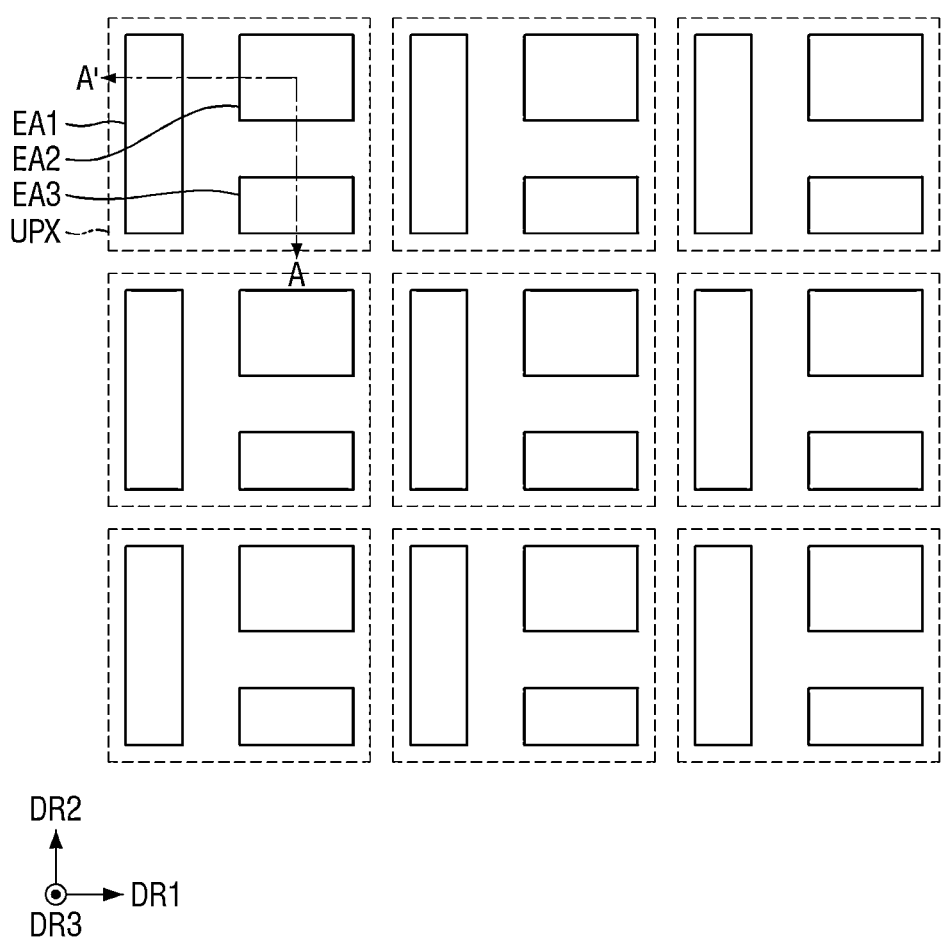
FIG. 5 is a layout diagram illustrating an embodiment of pixels of a display area.
Figure 6:
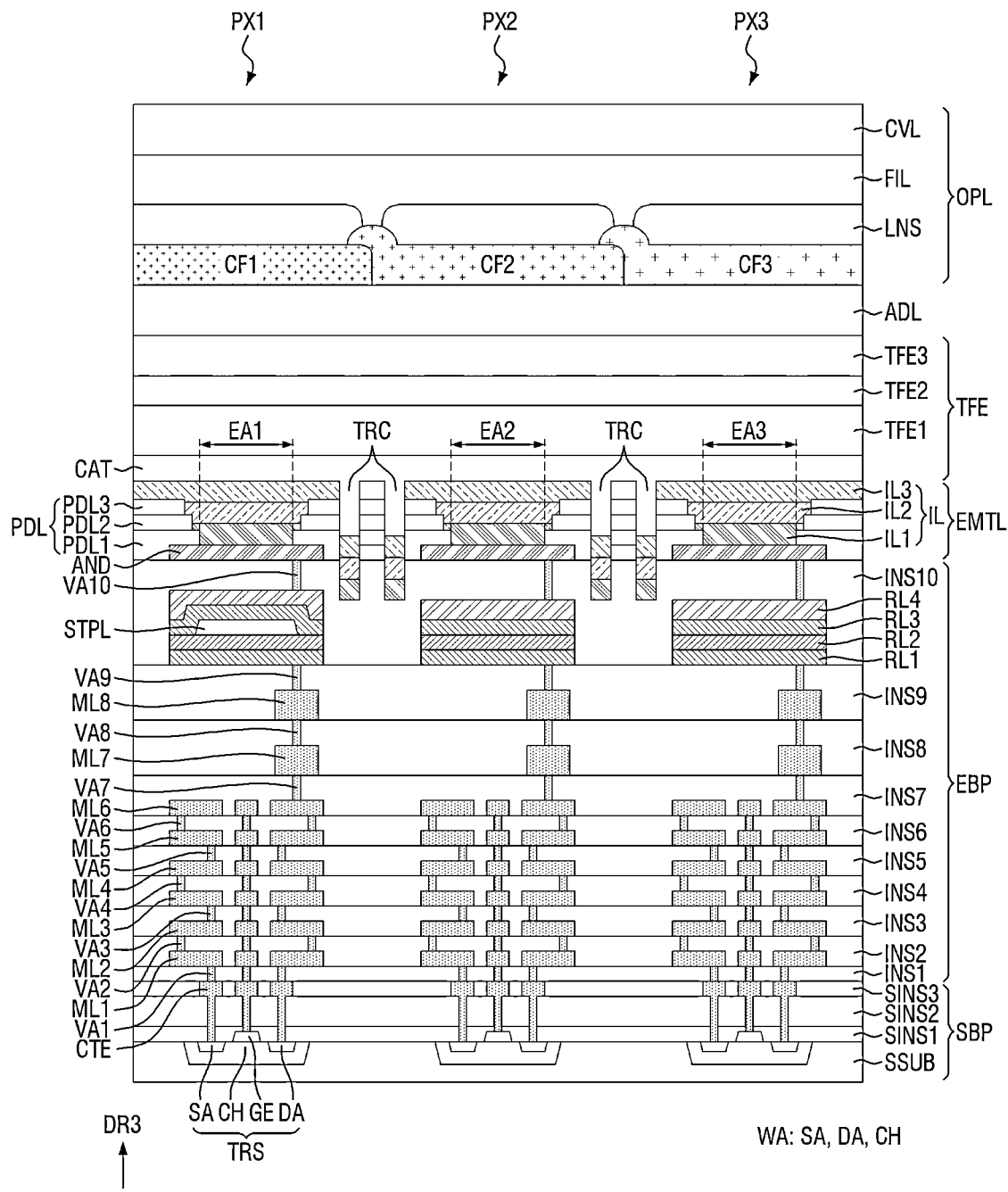
FIG. 6 is a cross-sectional view illustrating an embodiment of the display device taken along line A-A' of FIG. 5.

A plurality of unit pixels UPX (refer to FIG. 5) includes a plurality of pixels PX1, PX2, and PX3 (refer to FIG. 6). The plurality of pixels PX1, PX2, and PX3 may include a plurality of pixel transistors (e.g., T1 to T4 of FIG. 4). The plurality of pixel transistors may be formed by a semiconductor process and be disposed on a semiconductor substrate (e.g., SSUB of FIG. 6). In an embodiment, the plurality of pixel transistors may be formed as complementary metal oxide semiconductors ("CMOSs"), for example.

Each of the plurality of pixels PX1, PX2, and PX3 may be connected to any one of the plurality of first scan lines SL1, any one of the plurality of second scan lines SL2, any one of the plurality of emission control lines EML, and any one of the plurality of data lines DL. Each of the plurality of pixels PX1, PX2, and PX3 may receive a data voltage of the data line DL according to a first scan signal of the first scan line, and allow the light-emitting element to emit light according to the data voltage.

The non-display area NDA includes scan driving areas SDA, a data driving area DDA, and a pad area PDA.

The scan driving areas SDA may be areas in which a scan driver 610 and an emission driver 620 are disposed. It has been illustrated in FIG. 2 that the scan driver 610 is disposed on the left side of the display area DAA and the emission driver 620 is disposed on the right side of the display area DAA, but the disclosure is not limited thereto. In an embodiment, the scan drivers 610 and the emission drivers 620 may be disposed on both the left and right sides of the display area DAA, for example.

The scan driver 610 includes a plurality of scan transistors, and the emission driver 620 includes a plurality of light-emitting transistors. The plurality of scan transistors and the plurality of light-emitting transistors may be formed through a semiconductor process and be formed on the semiconductor substrate described above. In an embodiment, the plurality of scan transistors and the plurality of light-emitting transistors may be formed as CMOSs, for example.

The scan driver 610 may include a first scan signal output unit 611 and a second scan signal output unit 612. Each of the first scan signal output unit 611 and the second scan signal output unit 612 may receive a scan timing control signal SCS from a timing controller 400. The first scan signal output unit 611 may generate first scan signals according to the scan timing control signal SCS of the timing controller 400 and sequentially output the first scan signals to the first scan lines SL1. The second scan signal output unit 612 may generate second scan signals according to the scan timing control signal SCS and sequentially output the second scan signals to the second scan lines SL2.

The emission driver 620 may receive an emission timing control signal ECS from the timing controller 400. In addition, the emission driver 620 may generate emission control signals according to the emission timing control signal ECS and sequentially output the emission control signals to the emission control lines EML.

The data driving area DDA may be an area in which a data driver 700 is disposed. The data driver 700 may include a plurality of data transistors. The plurality of data transistors may be formed by a semiconductor process and be formed on the semiconductor substrate described above. In an embodiment, the plurality of data transistors may be formed as CMOSs, for example.

The data driver 700 may receive digital video data DATA and a data timing control signal DCS from the timing controller 400. The data driver 700 converts the digital video data DATA into analog data voltages according to the data timing control signal DCS and outputs the analog data voltages to the data lines DL. In this case, the pixels PX1, PX2, and PX3 may be selected by the first scan signals of the scan driver 610, and the data voltages may be supplied to the selected pixels PX1, PX2, and PX3.

The pad area PDA includes a plurality of pads PD disposed in the first direction DR1. Each of the plurality of pads PD may be exposed without being covered by a cover layer CVL (refer to FIG. 6) and a polarizing plate (not illustrated).

The heat dissipation layer 200 may overlap the display panel 100 in a third direction DR3, which is a thickness direction of the display panel 100. The heat dissipation layer 200 may be disposed on one surface, e.g., a rear surface, of the display panel 100. The heat dissipation layer 200 serves to dissipate heat generated from the display panel 100. The heat dissipation layer 200 may include a metal layer including graphite, silver (Ag), copper (Cu), or aluminum (Al) having relatively high thermal conductivity.

The circuit board 300 may be electrically connected to the plurality of pads PD of the pad area PDA of the display panel 100 using a conductive adhesive member such as an anisotropic conductive film. The circuit board 300 may be a flexible printed circuit board or a flexible film having a flexible material. It has been illustrated in FIG. 1 that the circuit board 300 is unbent, but the circuit board 300 may be bent. In this case, one end of the circuit board 300 may be disposed on the rear surface of the display panel 100. One end of the circuit board 300 may be an end opposite to an opposite end of the circuit board 300 connected to the plurality of pads PD of the pad area PDA of the display panel 100 using the conductive adhesive member.

The driving circuit 450 may include the timing controller 400 and a power supply unit 500.

The timing controller 400 may receive digital video data and timing signals from the outside. The timing controller 400 may generate the scan timing control signal SCS, the emission timing control signal ECS, and the data timing control signal DCS for controlling the display panel 100 according to the timing signals. The timing controller 400 may output the scan timing control signal SCS to the scan driver 610 and output the emission timing control signal ECS to the emission driver 620. The timing controller 400 may output the digital video data and the data timing control signal DCS to the data driver 700.

The power supply unit 500 may generate a plurality of panel driving voltages according to an external source voltage. In an embodiment, the power supply unit 500 may generate a common voltage ELVSS, a driving voltage ELVDD, and an initialization voltage Vint and supply the common voltage ELVSS, the driving voltage ELVDD, and the initialization voltage Vint to the display panel 100, for example. The common voltage ELVSS, the driving voltage ELVDD, and the initialization voltage Vint will be described later with reference to FIG. 4.

Each of the timing controller 400 and the power supply unit 500 may be formed as an integrated circuit ("IC") and attached to one surface of the circuit board 300. The scan timing control signal SCS, the emission timing control signal ECS, the digital video data DATA, and the data timing control signal DCS of the timing controller 400 may be supplied to the display panel 100 through the circuit board 300. The common voltage ELVSS, the driving voltage ELVDD, and the initialization voltage Vint of the power supply unit 500 may be supplied to the display panel 100 through the circuit board 300.

Figure 4:
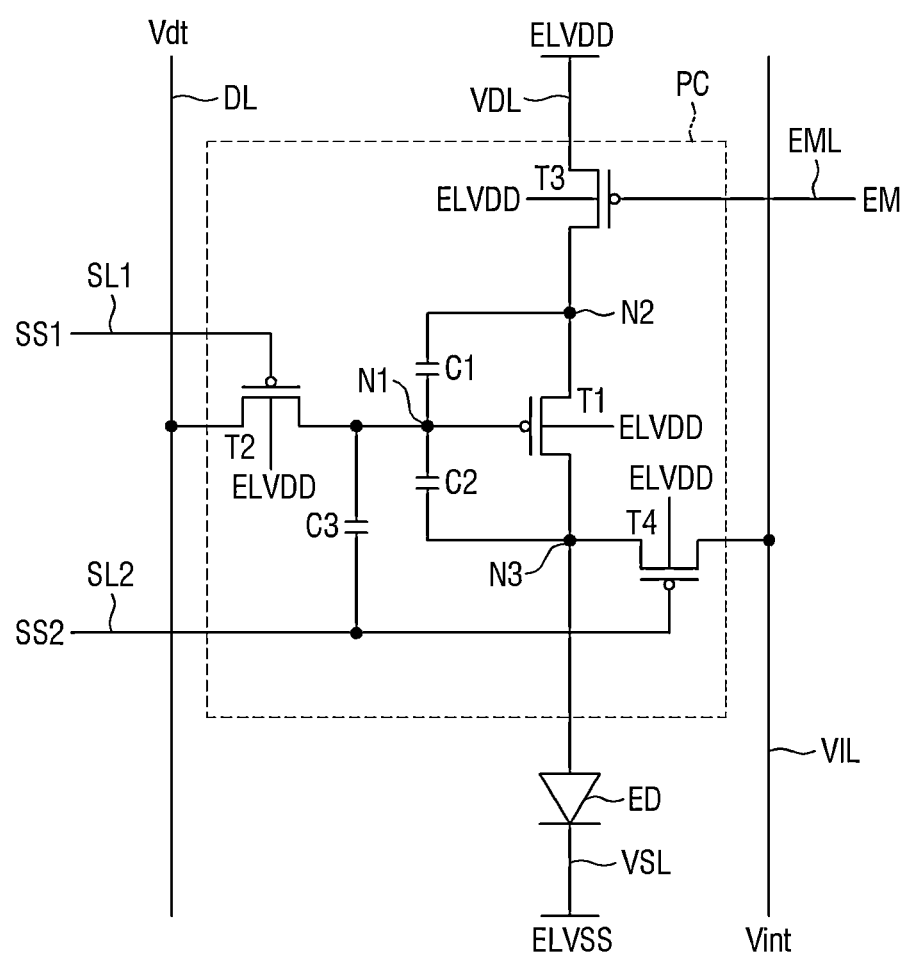
FIG. 4 is an equivalent circuit diagram of an embodiment of a first pixel.

FIG. 4 is an equivalent circuit diagram of an embodiment of a first pixel.

As illustrated in FIG. 4, a pixel PX (e.g., first pixel PX1 shown in FIG. 6) may be connected to a first scan line SL1, a second scan line SL2, an emission control line EML, an initialization voltage line VIL, a data line DL, a driving voltage line VDL, and a common voltage line VSL. Here, the common voltage line VSL may be connected to a common electrode (e.g., a cathode electrode) of a light-emitting element ED.

The pixel PX may include a pixel circuit PC and the light-emitting element ED.

The pixel circuit PC may include a first transistor T1, a second transistor T2, a third transistor T3, a fourth transistor T4, a first capacitor C1, a second capacitor C2, and a third capacitor C3.

The first transistor T1 (e.g., a driving transistor) may include a gate electrode, a source electrode, a drain electrode, and a body electrode. The first transistor T1 may control a source-drain current (hereinafter referred to as a driving current) according to a data voltage applied to the gate electrode. The driving current (e.g., Isd) flowing through a channel region of the first transistor T1 may be proportional to the square of a difference between a voltage Vsg between the source electrode and the gate electrode and a threshold voltage Vth of the first transistor T1 ($Isd = k \times (Vsg-Vth)^2$). Here, k refers to a proportional coefficient determined by a structure and physical properties of the first transistor T1, Vsg refers to a source-gate voltage of the first transistor T1, and Vth refers to the threshold voltage of the first transistor S1. The gate electrode of the first transistor T1 may be electrically connected to a first node N1, the source electrode of the first transistor T1 may be electrically connected to a second node N2, the drain electrode of the first transistor T1 may be electrically connected to a third node N3, and the body electrode of the first transistor T1 may be electrically connected to the driving voltage line VDL.

The light-emitting element ED may receive the driving current Isd to emit light. A light emission amount or luminance of the light-emitting element ED may be proportional to a magnitude of the driving current Isd. The light-emitting element ED may be an organic light-emitting diode including a first electrode, a second electrode, and an organic light-emitting layer disposed between the first electrode and the second electrode. In another embodiment, the light-emitting element ED may be an inorganic light-emitting element including a first electrode, a second electrode, and an inorganic semiconductor disposed between the first electrode and the second electrode. In another embodiment, the light-emitting element ED may be a quantum dot light-emitting element including a first electrode, a second electrode, and a quantum dot light-emitting layer disposed between the first electrode and the second electrode. In another embodiment, the light-emitting element ED may be a micro light-emitting diode. The first electrode of the light-emitting element ED may be connected to the third node N3. The second electrode of the light-emitting element ED may be connected to the common voltage line VSL. The second electrode of the light-emitting element ED may receive a common voltage (e.g., a relatively low potential voltage) from the common voltage line VSL.

The second transistor T2 may be turned on by a first scan signal SS1 of the first scan line SL1 to electrically connect the data line DL and the first node N1 to each other. A gate electrode of the second transistor T2 may be electrically connected to the first scan line SL1, a source electrode of the second transistor T2 may be electrically connected to the data line DL, a drain electrode of the second transistor T2 may be electrically connected to the first node N1, and a body electrode of the second transistor T2 may be electrically connected to the driving voltage line VDL. The data line DL may transmit a data signal DATA or a reference voltage Vref.

The third transistor T3 may be turned on by an emission control signal EM of the emission control line EML to electrically connect the driving voltage line VDL and the second node N2 to each other. A gate electrode of the third transistor T3 may be electrically connected to the emission control line EML, a source electrode of the third transistor T3 may be electrically connected to the driving voltage line VDL, a drain electrode of the third transistor T3 may be electrically connected to the second node N2, and a body electrode of the third transistor T3 may be electrically connected to the driving voltage line VDL.

The fourth transistor T4 may be turned on by a second scan signal SS2 of the second scan line SL2 to electrically connect the third node N3 and the initialization voltage line VIL to each other. A gate electrode of the fourth transistor T4 may be electrically connected to the second scan line SL2, a source electrode of the fourth transistor T4 may be electrically connected to the third node N3, a drain electrode of the fourth transistor T4 may be electrically connected to the initialization voltage line VIL, and a body electrode of the fourth transistor T4 may be electrically connected to the driving voltage line VDL. The number of initialization voltage lines VIL may be plural, and the plurality of initialization voltage lines VIL may be connected to each other. In an embodiment, the initialization voltage lines VIL may include a plurality of horizontal initialization voltage lines extending along the first direction DR1 and disposed in the second direction DR2 and a plurality of vertical initialization voltage lines extending along the second direction DR2 and disposed along the first direction DR1, and the horizontal initialization voltage lines and the vertical initialization voltage lines may be connected to each other, for example.

The first capacitor C1 may be electrically connected between the first node N1 and the second node N2. In an embodiment, a first electrode of the first capacitor C1 may be electrically connected to the first node N1, and a second electrode of the first capacitor C1 may be electrically connected to the second node N2, for example.

The second capacitor C2 may be electrically connected between the first node N1 and the third node N3. In an embodiment, a first electrode of the second capacitor C2 may be electrically connected to the first node N1, and a second electrode of the second capacitor C2 may be electrically connected to the third node N3, for example.

The third capacitor C3 may be electrically connected between the first node N1 and the second scan line SL2. In an embodiment, a first electrode of the third capacitor C3 may be electrically connected to the first node N1, and a second electrode of the third capacitor C3 may be electrically connected to the second scan line SL2, for example.

The third capacitor C3 may have a greater capacitance than that of the second capacitor C2, and the second capacitor C2 may have a greater capacitance than that of the first capacitor C1. In other words, the capacitance of the second capacitor C2 may be greater than the capacitance of the first capacitor C1 and smaller than the capacitance of the third capacitor C3.

In one pixel circuit PC, a capacitance ratio between the first to third capacitors C1 to C3 is as follows. In an embodiment, when the capacitance of the first capacitor C1 is 100%, the capacitance of the second capacitor C2 may be 31.3%, and the capacitance of the third capacitor C3 may be 18.8%, for example. In other words, based on the capacitance of the first capacitor C1, the capacitance of the second capacitor C2 may be set to 31.3% of the capacitance of the first capacitor C1, and the capacitance of the third capacitor C3 may be set to 18.8% of the capacitance of the first capacitor C1.

When the first transistor T1 and the third transistor T3 are turned on, the driving current is supplied to the light-emitting element ED, such that the light-emitting element ED may emit light.

At least one of the first to fourth transistors T1 to T4 described above may be a metal oxide semiconductor field effect transistor ("MOSFET"). In an embodiment, each of the first to fourth transistors T1 to T4 may be a P-type MOSFET. In another embodiment, each of the first to fourth transistors T1 to T4 may be an N-type MOSFET. In another embodiment, some transistors of the first to fourth transistors T1 to T4 may be P-type MOSFETs, and remaining transistors of the first to fourth transistors T1 to T4 may be N-type MOSFETs.

It has been illustrated in FIG. 4 that the first pixel PX1 includes four transistors T1 to T4 and three capacitors C1, C2, and C3, but it is to be noted that an equivalent circuit diagram of the first pixel PX1 is not limited to that illustrated in FIG. 4. In an embodiment, the numbers of transistors and capacitors of the first pixel PX1 are not limited to those illustrated in FIG. 4, for example.

In addition, an equivalent circuit diagram of the second pixel PX2 and an equivalent circuit diagram of the third pixel PX3 may be substantially the same as the equivalent circuit diagram of the first pixel PX1 described with reference to FIG. 4. Therefore, a description of the equivalent circuit diagram of the second pixel PX2 and the equivalent circuit diagram of the third pixel PX3 is omitted in the disclosure.

FIG. 5 is a layout diagram illustrating an embodiment of pixels of a display area.

Referring to FIG. 5, each of the plurality of pixels PX may includes a first emission area EA1 that is an emission area of the first pixel PX1, a second emission area EA2 that is an emission area of the second pixel PX2, and a third emission area EA3 that is an emission area of the third pixel PX3.

Each of the first emission area EA1, the second emission area EA2, and the third emission area EA3 may have a quadrangular shape such as a quadrangular shape, e.g., rectangular shape, a square shape, or a rhombic shape in a plan view. In an embodiment, the first emission area EA1 may have a quadrangular shape, e.g., rectangular shape, in a plan view, having short sides in the first direction DR1 and long sides in the second direction DR2, for example. In addition, each of the second emission area EA2 and the third emission area EA3 may have a quadrangular shape, e.g., rectangular shape, in a plan view, having long sides in the first direction DR1 and short sides in the second direction DR2.

A length of the first emission area EA1 in the first direction DR1 may be smaller than a length of the second emission area EA2 in the first direction DR1 and smaller than a length of the third emission area EA3 in the first direction DR1. The length of the second emission area EA2 in the first direction DR1 and the length of the third emission area EA3 in the first direction DR1 may be substantially the same as each other.

A length of the first emission area EA1 in the second direction DR2 may be greater than the sum of a length of the second emission area EA2 in the second direction DR2 and a length of the third emission area EA3 in the second direction DR2. The length of the second emission area EA2 in the second direction DR2 may be greater than the length of the third emission area EA3 in the second direction DR2.

It has been illustrated in FIG. 5 that each of the first emission area EA1, the second emission area EA2, and the third emission area EA3 has the quadrangular shape in a plan view, but the disclosure is not limited thereto. In an embodiment, each of the first emission area EA1, the second emission area EA2, and the third emission area EA3 may have other polygonal shapes other than the quadrangular shape, a circular shape, or an elliptical shape in a plan view, for example.

In each of the plurality of pixels PX, the first emission area EA1 and the second emission area EA2 may neighbor to each other in the first direction DR1. In addition, the first emission area EA1 and the third emission area EA3 may neighbor to each other in the first direction DR1. In addition, the second emission area EA2 and the third emission area EA3 may neighbor to each other in the second direction DR2. An area of the first emission area EA1, an area of the second emission area EA2, and an area of the third emission area EA3 may be different from each other.

The first emission area EA1 may emit light of a first color, the second emission area EA2 may emit light of a second color, and the third emission area EA3 may emit light of a third color. Here, the light of the first color may be light of a blue wavelength band, the light of the second color may be light of a green wavelength band, and the light of the third color may be light of a red wavelength band. In an embodiment, the blue wavelength band may indicate that a main peak wavelength of the light is included in a wavelength band of approximately 370 nanometers (nm) to approximately 460 nm, the green wavelength band may indicate that a main peak wavelength of the light is included in a wavelength band of approximately 480 nm to approximately 560 nm, and the red wavelength band may indicate that a main peak wavelength of the light is included in a wavelength band of approximately 600 nm and approximately 750 nm, for example.

It has been illustrated in FIG. 5 that each of the plurality of pixels PX includes three emission areas EA1, EA2, and EA3, but the disclosure is not limited thereto. That is, each of the plurality of pixels PX may also include four emission areas.

In addition, an arrangement of the emission areas of the plurality of pixels PX is not limited to that illustrated in FIG. 5. In an embodiment, the emission areas of the plurality of pixels PX may be disposed in a stripe structure in which they are disposed in the first direction DR1, a PenTile® structure in which they have a diamond arrangement, or a hexagonal structure in which emission areas having a hexagonal shape in a plan view are disposed, for example.

FIG. 6 is a cross-sectional view illustrating an embodiment of the display device taken along line A-A' of FIG. 5.

Referring to FIG. 6, the display panel 100 includes a semiconductor backplane SBP, a light-emitting element backplane EBP, a light-emitting element layer EMTL, an encapsulation layer TFE, an optical layer OPL, a cover layer CVL, and a polarizing plate.

The semiconductor backplane SBP may include a semiconductor substrate SSUB including a plurality of pixel transistors TRS, a plurality of semiconductor insulating films covering the plurality of pixel transistors TRS, and a plurality of contact terminals CTE electrically connected to the plurality of pixel transistors TRS, respectively. The plurality of pixel transistors TRS may be the first to fourth transistors T1 to T4 described with reference to FIG. 4.

The semiconductor substrate SSUB may be a silicon substrate, a germanium substrate, or a silicon-germanium substrate. The semiconductor substrate SSUB may be a substrate doped with first-type impurities. A plurality of well regions WA may be disposed in an upper surface of the semiconductor substrate SSUB. The plurality of well regions WA may be regions doped with second-type impurities. The second-type impurities may be different from the first-type impurities described above. In an embodiment, when the first-type impurities are p-type impurities, the second-type impurities may be n-type impurities, for example. In an alternative embodiment, when the first-type impurities are n-type impurities, the second-type impurities may be p-type impurities.

Each of the plurality of well regions WA includes a source region SA corresponding to a source electrode of the pixel transistor TRS, a drain region DA corresponding to a drain electrode of the pixel transistor TRS, and a channel region CH disposed between the source region SA and the drain region DA.

Each of the source region SA and the drain region DA may be a region doped with the first-type impurities. A gate electrode GE of the pixel transistor TRS may overlap the well region WA in the third direction DR3. The channel region CH may overlap the gate electrode GE in the third direction DR3. The source region SA may be disposed on one side of the gate electrode GE, and the drain region DA may be disposed on an opposite side of the gate electrode GE.

In an embodiment, each of the plurality of well regions WA further includes a first low-concentration impurity region disposed between the channel region CH and the source region SA and a second low-concentration impurity region disposed between the channel region CH and the drain region DA. The first low-concentration impurity region may be a region having a lower impurity concentration than that of the source region SA. The second low-concentration impurity region may be a region having a lower impurity concentration than that of the drain region DA. A distance between the source region SA and the drain region DA may be increased by the first low-concentration impurity region and the second low-concentration impurity region. Therefore, a length of the channel region CH of each of the pixel transistors TRS may increase, and thus, punch-through and hot carrier phenomena caused by a short channel may be prevented.

A first semiconductor insulating film SINS1 may be disposed on the semiconductor substrate SSUB. The first semiconductor insulating film SINS1 may be formed as a silicon nitride (SiCN) or silicon oxide ($SiO_x$)-based inorganic film, but the disclosure is not limited thereto.

A second semiconductor insulating film SINS2 may be disposed on the first semiconductor insulating film SINS1. The second semiconductor insulating film SINS2 may be formed as a silicon oxide ($SiO_x$)-based inorganic film, but the disclosure is not limited thereto.

The plurality of contact terminals CTE may be disposed on the second semiconductor insulating film SINS2. Each of the plurality of contact terminals CTE may be connected to any one of the gate electrode GE, the source region SA, and the drain region DA of each of the pixel transistors TRS through a hole penetrating through the first semiconductor insulating film SINS1 and the second semiconductor insulating film SINS2. Each of the plurality of contact terminals CTE may include or consist of any one of copper (Cu), aluminum (Al), tungsten (W), molybdenum (Mo), chromium (Cr), gold (Au), titanium (Ti), nickel (Ni), and neodymium (Nd), or alloys thereof.

A third semiconductor insulating film SINS3 may be disposed on side surfaces of each of the plurality of contact terminals CTE. An upper surface of each of the plurality of contact terminals CTE may be exposed without being covered by the third semiconductor insulating film SINS3. The third semiconductor insulating film SINS3 may be formed as a silicon oxide ($SiO_x$)-based inorganic film, but the disclosure is not limited thereto.

The semiconductor substrate SSUB may be replaced with a glass substrate or a polymer resin substrate such as a polyimide substrate. In this case, thin film transistors may be disposed on the glass substrate or the polymer resin substrate. The glass substrate may be a rigid substrate that is not bent, and the polymer resin substrate may be a flexible substrate that may be bent or curved.

The light-emitting element backplane EBP includes first to eighth metal layers ML1 to ML8, reflective electrodes RL1 to RL4, a plurality of vias VA1 to VA10, and a step layer STPL. In addition, the light-emitting element backplane EBP includes a plurality of inter-insulating films INS1 to INS10 disposed between the first to sixth metal layers ML1 to ML6.

The first to eighth metal layers ML1 to ML8 serve to implement a circuit of the first pixel PX1 illustrated in FIG. 4 by connecting the plurality of contact terminals CTE exposed from the semiconductor backplane SBP to each other. That is, only the first to fourth transistors T1 to T4 are formed in the semiconductor backplane SBP, and the connection between the first to fourth transistors T1 to T4 and the formation of the first capacitor C1, the second capacitor C2, and the third transistor C3 are performed through the first to eighth metal layers ML1 to ML8. In addition, the connection between the drain region corresponding to the drain electrode of the fourth transistor T4, the source region corresponding to the source electrode of the fifth transistor T5, and the first electrode of the light-emitting element ED is also performed through the first to eighth metal layers ML1 to ML8.

A first inter-insulating film INS1 may be disposed on the semiconductor backplane SBP. Each of first vias VA1 may penetrate through the first inter-insulating film INS1 to be connected to the contact terminal CTE exposed from the semiconductor backplane SBP. Each of the first metal layers ML1 may be disposed on the first inter-insulating film INS1 and be connected to the first via VA1.

A second inter-insulating film INS2 may be disposed on the first inter-insulating film INS1 and the first metal layers ML1. Each of second vias VA2 may penetrate through the second inter-insulating film INS2 to be connected to the exposed first metal layer ML1. Each of the second metal layers ML2 may be disposed on the second inter-insulating film INS2 and be connected to the second via VA2.

A third inter-insulating film INS3 may be disposed on the second inter-insulating film INS2 and the second metal layers ML2. Each of third vias VA3 may penetrate through the third inter-insulating film INS3 to be connected to the exposed second metal layer ML2. Each of the third metal layers ML3 may be disposed on the third inter-insulating film INS3 and be connected to the third via VA3.

A fourth inter-insulating film INS4 may be disposed on the third inter-insulating film INS3 and the third metal layers ML3. Each of fourth vias VA4 may penetrate through the fourth inter-insulating film INS4 to be connected to the exposed third metal layer ML3. Each of the fourth metal layers ML4 may be disposed on the fourth inter-insulating film INS4 and be connected to the fourth via VA4.

A fifth inter-insulating film INS5 may be disposed on the fourth inter-insulating film INS4 and the fourth metal layers ML4. Each of fifth vias VA5 may penetrate through the fifth inter-insulating film INS5 to be connected to the exposed fourth metal layer ML4. Each of the fifth metal layers ML5 may be disposed on the fifth inter-insulating film INS5 and be connected to the fifth via VA5.

A sixth inter-insulating film INS6 may be disposed on the fifth inter-insulating film INS5 and the fifth metal layers ML5. Each of sixth vias VA6 may penetrate through the sixth inter-insulating film INS6 to be connected to the exposed fifth metal layer ML5. Each of the sixth metal layers ML6 may be disposed on the sixth inter-insulating film INS6 and be connected to the sixth via VA6.

A seventh inter-insulating film INS7 may be disposed on the sixth inter-insulating film INS6 and the sixth metal layers ML6. Each of seventh vias VA7 may penetrate through the seventh inter-insulating film INS7 to be connected to the exposed sixth metal layer ML6. Each of the seventh metal layers ML7 may be disposed on the seventh inter-insulating film INS7 and be connected to the seventh via VA7.

An eighth inter-insulating film INS8 may be disposed on the seventh inter-insulating film INS7 and the seventh metal layers ML7. Each of eighth vias VA8 may penetrate through the eighth inter-insulating film INS8 to be connected to the exposed seventh metal layer ML7. Each of the eighth metal layers ML8 may be disposed on the eighth inter-insulating film INS8 and be connected to the eighth via VA8.

The first to eighth metal layers ML1 to ML8 and the first to eighth vias VA1 to VA8 may include or consist of substantially the same material as each other. Each of the first to eighth metal layers ML1 to ML8 and the first to eighth vias VA1 to VA8 may include or consist of any one of copper (Cu), aluminum (Al), tungsten (W), molybdenum (Mo), chromium (Cr), gold (Au), titanium (Ti), nickel (Ni), and neodymium (Nd), or alloys thereof. The first to eighth vias VA1 to VA8 may include or consist of substantially the same material as each other. The first to eighth inter-insulating films INS1 to INS8 may be formed as silicon oxide (SiO$_x$)-based inorganic films, but the disclosure is not limited thereto.

Each of a thickness of the first metal layer ML1, a thickness of the second metal layer ML2, a thickness of the third metal layer ML3, a thickness of the fourth metal layer ML4, a thickness of the fifth metal layer ML5, and a thickness of the sixth metal layer ML6 may be greater than each of a thickness of the first via VA1, a thickness of the second via VA2, a thickness of the third via VA3, a thickness of the fourth via VA4, a thickness of the fifth via VA5, and a thickness of the sixth via VA6. Each of the thickness of the second metal layer ML2, the thickness of the third metal layer ML3, the thickness of the fourth metal layer ML4, the thickness of the fifth metal layer ML5, and the thickness of the sixth metal layer ML6 may be greater than the thickness of the first metal layer ML1. The thickness of the second metal layer ML2, the thickness of the third metal layer ML3, the thickness of the fourth metal layer ML4, the thickness of the fifth metal layer ML5, and the thickness of the sixth metal layer ML6 may be substantially the same as each other. In an embodiment, the thickness of the first metal layer ML1 may be approximately 1360 angstroms (Å), each of the thickness of the second metal layer ML2, the thickness of the third metal layer ML3, the thickness of the fourth metal layer ML4, the thickness of the fifth metal layer ML5, and the thickness of the sixth metal layer ML6 may be approximately 1440 Å, and each of the thickness of the first via VA1, the thickness of the second via VA2, the thickness of the third via VA3, the thickness of the fourth via VA4, the thickness of the fifth via VA5, and the thickness of the sixth via VA6 may be approximately 1150 Å, for example.

Each of a thickness of the seventh metal layer ML7 and a thickness of the eighth metal layer ML8 may be greater than each of the thickness of the first metal layer ML1, the thickness of the second metal layer ML2, the thickness of the third metal layer ML3, the thickness of the fourth metal layer ML4, the thickness of the fifth metal layer ML5, and the thickness of the sixth metal layer ML6. Each of the thickness of the seventh metal layer ML7 and the eighth metal layer ML8 may be greater than each of a thickness of the seventh via VA7 and a thickness of the eighth via VA8. Each of the thickness of the seventh via VA7 and the thickness of the eighth via VA8 may be greater than each of the thickness of the first via VA1, the thickness of the second via VA2, the thickness of the third via VA3, the thickness of the fourth via VA4, the thickness of the fifth via VA5, and the thickness of the sixth via VA6. The thickness of the seventh metal layer ML7 and the thickness of the eighth metal layer ML8 may be substantially the same as each other. In an embodiment, each of the thickness of the seventh metal layer ML7 and the thickness of the eighth metal layer ML8 may be approximately 9000 Å, for example. Each of the thickness of the seventh via VA7 and the thickness of the eighth via VA8 may be approximately 6000 Å.

A ninth inter-insulating film INS9 may be disposed on the eighth inter-insulating film INS8 and the eighth metal layers ML8. The ninth inter-insulating film INS9 may be formed as a silicon oxide (SiO$_x$)-based inorganic film, but the disclosure is not limited thereto.

Each of ninth vias VA9 may penetrate through the ninth inter-insulating film INS9 to be connected to the exposed eighth metal layer ML8. Each of the ninth vias VA9 may include or consist of any one of copper (Cu), aluminum (Al), tungsten (W), molybdenum (Mo), chromium (Cr), gold (Au), titanium (Ti), nickel (Ni), and neodymium (Nd), or alloys thereof. A thickness of the ninth via VA9 may be approximately 16500 Å.

Each of first reflective electrodes RL1 may be disposed on the ninth inter-insulating film INS9 and be connected to the ninth via VA9. Each of the first reflective electrodes RL1 may include or consist of any one of copper (Cu), aluminum (Al), tungsten (W), molybdenum (Mo), chromium (Cr), gold (Au), titanium (Ti), nickel (Ni), and neodymium (Nd), or alloys thereof.

Each of second reflective electrodes RL2 may be disposed on the first reflective electrode RL1. Each of the second reflective electrodes RL2 may include or consist of any one of copper (Cu), aluminum (Al), tungsten (W), molybdenum (Mo), chromium (Cr), gold (Au), titanium (Ti), nickel (Ni), and neodymium (Nd), or alloys thereof. In an embodiment, each of the second reflective electrodes RL2 may include or consist of titanium nitride (TiN), for example.

In the first pixel PX1, the step layer STPL may be disposed on the second reflective electrode RL2. The step layer STPL may not be disposed in each of the second pixel PX2 and the third pixel PX3. A thickness of the step layer STPL may be set in consideration of a wavelength of the light of the first color and a distance from a first light-emitting layer of the first pixel PX1 to a fourth reflective electrode RL4 so as to be advantageous in reflecting the light of the first color emitted from the first light-emitting layer of the first pixel PX1. The step layer STPL may be formed as a silicon nitride (SiCN) or silicon oxide (SiO$_x$)-based inorganic film, but the disclosure is not limited thereto. A thickness of the step layer STPL may be approximately 400 Å.

In the first pixel PX1, a third reflective electrode RL3 may be disposed on the second reflective electrode RL2 and the step layer STPL. In the second pixel PX2 and the third pixel PX3, third reflective electrodes RL3 may be disposed on the second reflective electrodes RL2. Each of the third reflective electrodes RL3 may include or consist of any one of copper (Cu), aluminum (Al), tungsten (W), molybdenum (Mo), chromium (Cr), gold (Au), titanium (Ti), nickel (Ni), and neodymium (Nd), or alloys thereof.

At least one of the first reflective electrodes RL1, the second reflective electrodes RL2, and the third reflective electrodes RL3 may be omitted.

Each of fourth reflective electrodes RL4 may be disposed on the third reflective electrode RL3. The fourth reflective electrodes RL4 may be layers reflecting light from first to third intermediate layers IL1, IL2, and IL3. The fourth reflective electrodes RL4 may include a metal having relatively high reflectivity so as to be advantageous in reflecting the light. Each of the fourth reflective electrodes RL4 may include or consist of aluminum (Al), a stacked structure (Ti/Al/Ti) of aluminum and titanium, a stacked structure ("ITO/Al/ITO") of aluminum and indium tin oxide ("ITO"), silver (Ag), palladium (Pd), an APC alloy, which is an alloy of copper (Cu), and a stacked structure ("ITO/APC/ITO") of an APC alloy and ITO, but the disclosure is not limited thereto. A thickness of each of the fourth reflective electrodes RL4 may be approximately 850 Å.

A tenth inter-insulating film INS10 may be disposed on the ninth inter-insulating film INS9 and the fourth reflective electrodes RL4. The tenth inter-insulating film INS10 may be formed as a silicon oxide (SiO$_x$)-based inorganic film, but the disclosure is not limited thereto.

Each of tenth vias VA10 may penetrate through the tenth inter-insulating film INS10 to be connected to the exposed fourth reflective electrode RL4. Each of the tenth vias VA10 may include or consist of any one of copper (Cu), aluminum (Al), tungsten (W), molybdenum (Mo), chromium (Cr), gold (Au), titanium (Ti), nickel (Ni), and neodymium (Nd), or alloys thereof. Due to the step layer STPL, a thickness of the tenth via VA10 in the first pixel PX1 may be smaller than a thickness of the tenth via VA10 in each of the second pixel PX2 and the third pixel PX3. In an embodiment, the thickness of the tenth via VA10 in the first pixel PX1 may be approximately 800 Å, and the thickness of the tenth via VA10 in each of the second pixel PX2 and the third pixel PX3 may be approximately 1200 Å, for example.

The light-emitting element layer EMTL may be disposed on the light-emitting element backplane EBP. The light-emitting element layer EMTL may include light-emitting elements ED each including a first electrode AND, an intermediate layer IL, and a second electrode CAT, and a pixel defining film PDL. A plurality of trenches TRC may be defined in the light-emitting element layer EMTL.

The first electrode AND of each of the light-emitting elements ED may be disposed on the tenth inter-insulating film INS10 and be connected to the tenth via VA10. The first electrode AND of each of the light-emitting elements ED may be connected to the drain region DA or the source region SA of the pixel transistor TRS through the tenth via VA10, the first to fourth reflective electrodes RL1 to RL4, the first to ninth vias VA1 to VA9, the first to eighth metal layers ML1 to ML8, and the contact terminal CTE. The first electrode AND of each of the light-emitting elements ED may include or consist of any one of copper (Cu), aluminum (Al), tungsten (W), molybdenum (Mo), chromium (Cr), gold (Au), titanium (Ti), nickel (Ni), and neodymium (Nd), or alloys thereof. In an embodiment, the first electrode AND of each of the light-emitting elements ED may include or consist of titanium nitride (TiN), for example.

The pixel defining film PDL may be disposed on a partial area of the first electrode AND of each of the light-emitting elements ED. The pixel defining film PDL may cover an edge of the first electrode AND of each of the light-emitting elements ED. The pixel defining film PDL serves to partition first emission areas EA1, second emission areas EA2, and third emission areas EA3.

The first emission area EA1 may be defined as an area in which the first electrode AND, the intermediate layer IL, and the second electrode CAT are sequentially stacked in the first pixel PX1 to emit light. The second emission area EA2 may be defined as an area in which the first electrode AND, the intermediate layer IL, and the second electrode CAT are sequentially stacked in the second pixel PX2 to emit light. The third emission area EA3 may be defined as an area in which the first electrode AND, the intermediate layer IL, and the second electrode CAT are sequentially stacked in the third pixel PX3 to emit light.

The pixel defining film PDL may include first to third pixel defining films PDL1, PDL2, and PDL3. The first pixel defining film PDL1 may be disposed on the edge of the first electrode AND of each of the light-emitting elements ED, the second pixel defining film PDL2 may be disposed on the first pixel defining film PDL1, and the third pixel defining film PDL3 may be disposed on the second pixel defining film PDL2. The first pixel defining film PDL1, the second pixel defining film PDL2, and the third pixel defining film PDL3 may be formed as silicon oxide ($SiO_x$)-based inorganic films, but the disclosure is not limited thereto. Each of a thickness of the first pixel defining film PDL1, a thickness of the second pixel defining film PDL2, and a thickness of the third pixel defining film PDL3 may be approximately 500 Å.

Each of the plurality of trenches TRC may penetrate through the first pixel defining film PDL1, the second pixel defining film PDL2, and the third pixel defining film PDL3. In each of the plurality of trenches TRC, the tenth inter-insulating film INS10 may have a shape in which a portion thereof trenches.

At least one trench TRC may be disposed between the pixels PX1, PX2, and PX3 neighboring to each other. It has been illustrated in FIG. 6 that two trenches TRC are defined between the pixels PX1, PX2, and PX3 neighboring to each other, but the disclosure is not limited thereto.

The intermediate layer IL may include a first intermediate layer IL1, a second intermediate layer IL2, and a third intermediate layer IL3.

The intermediate layer IL may have a tandem structure including a plurality of intermediate layers IL1, IL2, and IL3 emitting different light. In an embodiment, the intermediate layer IL may include a first intermediate layer IL1 emitting light of a first color, a second intermediate layer IL2 emitting light of a third color, and a third intermediate layer IL3 emitting light of a second color, for example. The first intermediate layer IL1, the second intermediate layer IL2, and the third intermediate layer IL3 may be sequentially stacked.

The first intermediate layer IL1 may have a structure in which a first hole transporting layer, a first organic light-emitting layer emitting the light of the first color, and a first electron transporting layer are sequentially stacked. The second intermediate layer IL2 may have a structure in which a second hole transporting layer, a second organic light-emitting layer emitting the light of the third color, and a second electron transporting layer are sequentially stacked. The third intermediate layer IL3 may have a structure in which a third hole transporting layer, a third organic light-emitting layer emitting the light of the second color, and a third electron transporting layer are sequentially stacked.

A first charge generation layer for supplying charges to the second intermediate layer IL2 and supplying electrons to the first intermediate layer IL1 may be disposed between the first intermediate layer IL1 and the second intermediate layer IL2. A second charge generation layer for supplying charges to the third intermediate layer IL3 and supplying electrons to the second intermediate layer IL2 may be disposed between the second intermediate layer IL2 and the third intermediate layer IL3.

The first intermediate layer IL1 may be disposed on the first electrodes AND and the pixel defining film PDL, and may be disposed on a bottom surface of each of the trenches TRC. Due to the trenches TRC, the first intermediate layer IL1 may be disconnected between the pixels PX1, PX2, and PX3 neighboring to each other. The second intermediate layer IL2 may be disposed on the first intermediate layer IL1. Due to the trenches TRC, the second intermediate layer IL2 may be disconnected between the pixels PX1, PX2, and PX3 neighboring to each other. The third intermediate layer IL3 may be disposed on the second intermediate layer IL2. Due to the trenches TRC, the third intermediate layer IL3 may be disconnected between the pixels PX1, PX2, and PX3 neighboring to each other. That is, each of the plurality of trenches TRC may be a structure for disconnecting the first to third intermediate layers IL1, IL2, and IL3 of the light-emitting element layer EMTL between the pixels PX1, PX2, and PX3 neighboring to each other.

In order to stably disconnect the first to third intermediate layers IL1, IL2, and IL3 of the light-emitting element layer EMTL between the pixels PX1, PX2, and PX3 neighboring to each other, a height of each of the plurality of trenches TRC may be greater than a height of the pixel defining film PDL. The height of each of the plurality of trenches TRC refers to a length of each of the plurality of trenches TRC in the third direction DR3. The height of the pixel defining film PDL refers to a length of the pixel defining film PDL in the third direction DR3.

In order to disconnect the first to third intermediate layers IL1, IL2, and IL3 of the light-emitting element layer EMTL between the pixels PX1, PX2, and PX3 neighboring to each other, other structures may exist instead of the trenches TRC. In an embodiment, instead of the trenches TRC, partition walls having a reverse tapered shape may be disposed on the pixel defining film PDL, for example.

The number of intermediate layers IL1, IL2, and IL3 emitting the different light is not limited to that illustrated in FIG. 6. In an embodiment, the intermediate layer IL may include two intermediate layers, for example. In this case, any one of the two intermediate layers may be substantially the same as the first intermediate layer IL1, and the other of the two intermediate layers may include a second hole transporting layer, a second organic light-emitting layer, a third organic light-emitting layer, and a second electron transporting layer. In this case, a charge generation layer for supplying electrons to any one intermediate layer and supplying charges to the other intermediate layer may be disposed between the two intermediate layers.

It has been illustrated in FIG. 6 that the first to third intermediate layers IL1, IL2, and IL3 are all disposed in the first emission area EA1, the second emission area EA2, and the third emission area EA3, but the disclosure is not limited thereto. In an embodiment, the first intermediate layer IL1 may be disposed in the first emission area EA1, and may not be disposed in the second emission area EA2 and the third emission area EA3, for example. In addition, the second intermediate layer IL2 may be disposed in the second emission area EA2, and may not be disposed in the first emission area EA1 and the third emission area EA3. In addition, the third intermediate layer IL3 may be disposed in the third emission area EA3, and may not be disposed on the first emission area EA1 and the second emission area EA2. In this case, first to third color filters CF1, CF2, and CF3 of the optical layer OPL may be omitted.

The second electrode CAT may be disposed on the third intermediate layer IL3. The second electrode CAT may be disposed on the third intermediate layer IL3 in each of the plurality of trenches TRC. The second electrode CAT may include or consist of a transparent conductive material ("TCO") such as ITO or indium zinc oxide ("IZO") capable of transmitting light therethrough or a semi-transmissive conductive material such as magnesium (Mg), silver (Ag), or an alloy of magnesium (Mg) and silver (Ag). When the second electrode CAT includes or consists of the semi-transmissive conductive material, emission efficiency of each of the first to third pixels PX1, PX2, and PX3 may be increased by a micro cavity.

The encapsulation layer TFE may be disposed on the light-emitting element layer EMTL. The encapsulation layer TFE may include at least one inorganic film TFE1 or TFE3 in order to prevent oxygen or moisture from permeating into the light-emitting element layer EMTL. In addition, the encapsulation layer TFE may include at least one organic film in order to protect the light-emitting element layer EMTL from foreign substances such as dust. In an embodiment, the encapsulation layer TFE may include a first encapsulation inorganic film TFE1, an encapsulation organic film TFE2, and a second encapsulation inorganic film TFE3, for example.

The first encapsulation inorganic film TFE1 may be disposed on the second electrode CAT, the encapsulation organic film TFE2 may be disposed on the first encapsulation inorganic film TFE1, and the second encapsulation inorganic film TFE3 may be disposed on the encapsulation organic film TFE2. The first encapsulation inorganic film TFE1 and the second encapsulation inorganic film TFE3 may be formed as multiple films in which one or more inorganic films of a silicon nitride ($SiN_x$) layer, a silicon oxynitride (SiON) layer, a silicon oxide ($SiO_x$) layer, a titanium oxide ($TiO_x$) layer, and an aluminum oxide ($AlO_x$) layer are alternately stacked. The encapsulation organic film TFE2 may include or consist of a monomer. In an alternative embodiment, the encapsulation organic film TFE2 may be an organic film including an acrylic resin, an epoxy resin, a phenolic resin, a polyamide resin, a polyimide resin, or the like.

An adhesive layer ADL may be a layer for adhering the encapsulation layer TFE and the optical layer OPL to each other. The adhesive layer ADL may be a double-sided adhesive member. In addition, the adhesive layer ADL may be a transparent adhesive member such as a transparent adhesive or a transparent adhesive resin.

The optical layer OPL includes a plurality of color filters CF1, CF2, and CF3, a plurality of lenses LNS, and a filling layer FIL. The plurality of color filters CF1, CF2, and CF3 may include first to third color filters CF1, CF2, and CF3. The first to third color filters CF1, CF2, and CF3 may be disposed on the adhesive layer ADL.

The first color filter CF1 may overlap the first emission area EA1 of the first pixel PX1. The first color filter CF1 may transmit the light of the first color, that is, the light of the blue wavelength band, therethrough. The blue wavelength band may be approximately 370 nm to approximately 460 nm. Therefore, the first color filter CF1 may transmit the light of the first color among light emitted from the first emission area EA1 therethrough.

The second color filter CF2 may overlap the second emission area EA2 of the second pixel PX2. The second color filter CF2 may transmit the light of the second color, that is, the light of the green wavelength band, therethrough. The green wavelength band may be approximately 480 nm to approximately 560 nm. Therefore, the second color filter CF2 may transmit the light of the second color among light emitted from the second emission area EA2 therethrough.

The third color filter CF3 may overlap the third emission area EA3 of the third pixel PX3. The third color filter CF3 may transmit the light of the third color, that is, the light of the red wavelength band, therethrough. The red wavelength band may be approximately 600 nm to approximately 750 nm. Therefore, the third color filter CF3 may transmit the light of the third color among light emitted from the third emission area EA3 therethrough.

Each of the plurality of lenses LNS may be disposed on each of the first color filter CF1, the second color filter CF2, and the third color filter CF3. Each of the plurality of lenses LNS may be a structure for increasing a ratio of light directed to a front surface of the display device 10. Each of the plurality of lenses LNS may have a cross-sectional shape convex in an upward direction.

The filling layer FIL may be disposed on the plurality of lenses LNS. The filling layer FIL may have a predetermined refractive index so that light travels in the third direction DR3 at an interface between the plurality of lenses LNS and the filling layer FIL. In addition, the filling layer FIL may be a planarizing layer. The filling layer FIL may be an organic film including an acrylic resin, an epoxy resin, a phenolic resin, a polyamide resin, a polyimide resin, or the like.

The cover layer CVL may be disposed on the filling layer FIL. The cover layer CVL may be a glass substrate or a polymer resin such as a resin. When the cover layer CVL is the glass substrate, the cover layer CVL may be attached onto the filling layer FIL. In this case, the filling layer FIL may serve to adhere the cover layer CVL. When the cover layer CVL is the glass substrate, the cover layer CVL may serve as an encapsulation substrate. When the cover layer CVL is the polymer resin such as the resin, the cover layer CVL may be directly applied onto the filling layer FIL.

The polarizing plate may be disposed on one surface of the cover layer CVL. The polarizing plate may be a structure for preventing deterioration in visibility due to external light reflection. The polarizing plate may include a linear polarizing plate and a phase retardation film. In an embodiment, the phase retardation film may be a λ/4 plate (quarter-wave plate), for example, but the disclosure is not limited thereto. However, when visibility due to external light reflection is sufficiently improved by the first to third color filters CF1, CF2, and CF3, the polarizing plate may be omitted.

Figure 7:
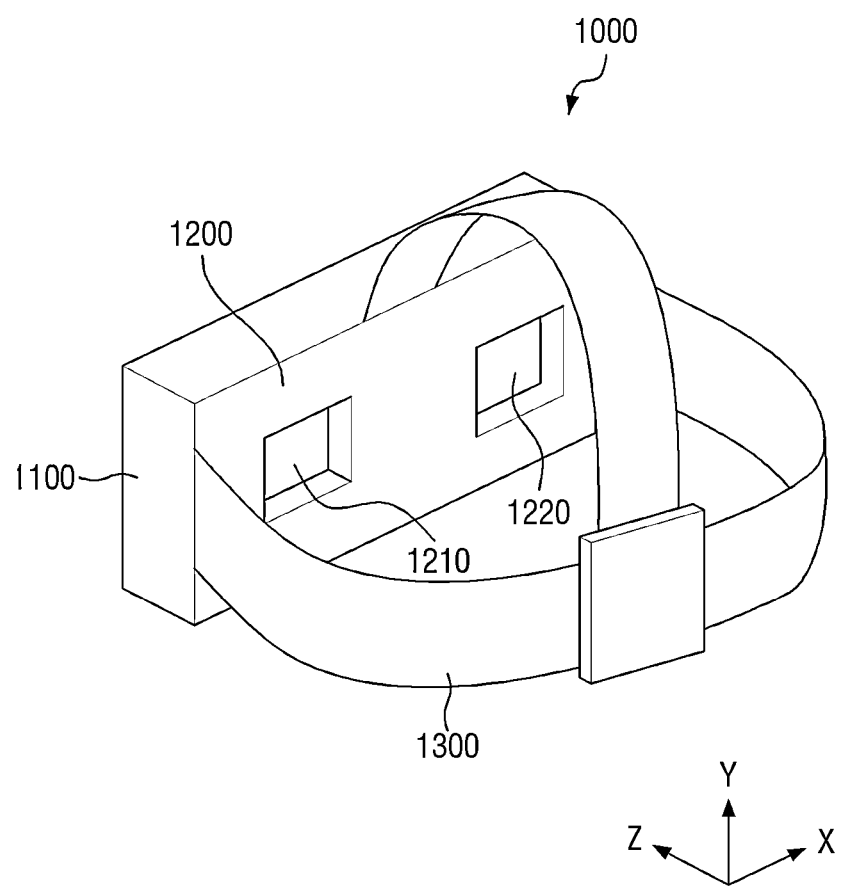
FIG. 7 is a perspective view illustrating an embodiment of a head mounted display ("HMID") device.
Figure 8:
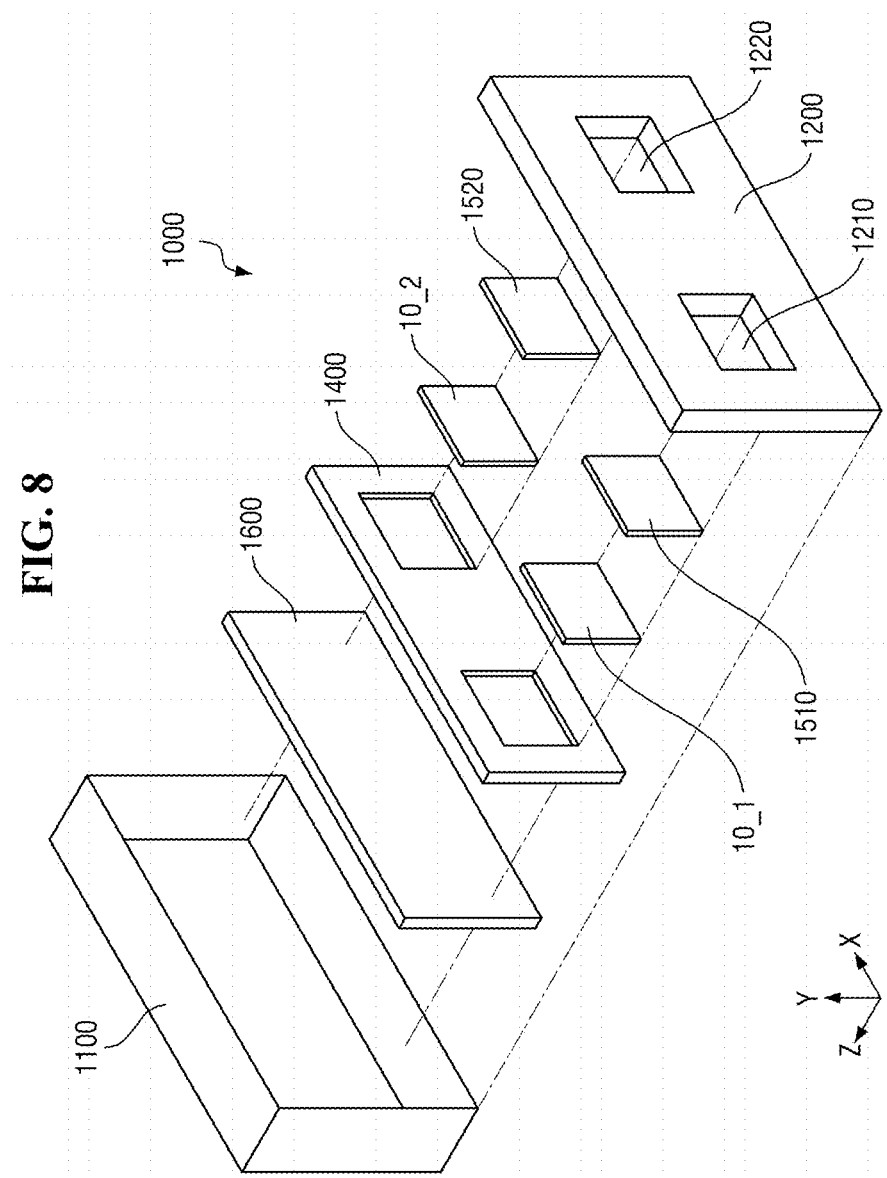
FIG. 8 is an exploded perspective view illustrating an embodiment of the HMD device of FIG. 7.

FIG. 7 is a perspective view illustrating an embodiment of a head mounted display ("HMD") device. FIG. 8 is an exploded perspective view illustrating an embodiment of the HMD device of FIG. 7.

Referring to FIGS. 7 and 8, an HMD device 1000 in an embodiment includes a first display device 10_1, a second display device 10_2, a display device housing part 1100, a housing part cover 1200, a first eyepiece 1210, a second eyepiece 1220, a head mounted band 1300, a middle frame 1400, a first optical member 1510, a second optical member 1520, a control circuit board 1600, and a connector.

The first display device 10_1 provides an image to a user's left eye, and the second display device 10_2 provides an image to a user's right eye. Each of the first display device 10_1 and the second display device 10_2 is substantially the same as the display device 10 described with reference to FIGS. 1 to 6, and a description of the first display device 10_1 and the second display device 10_2 is thus omitted.

The first optical member 1510 may be disposed between the first display device 10_1 and the first eyepiece 1210. The second optical member 1520 may be disposed between the second display device 10_2 and the second eyepiece 1220. Each of the first optical member 1510 and the second optical member 1520 may include at least one convex lens.

The middle frame 1400 may be disposed between the first display device 10_1 and the control circuit board 1600 and be disposed between the second display device 10_2 and the control circuit board 1600. The middle frame 1400 serves to support and fix the first display device 10_1, the second display device 10_2, and the control circuit board 1600.

The control circuit board 1600 may be disposed between the middle frame 1400 and the display device housing part 1100. The control circuit board 1600 may be connected to the first display device 10_1 and the second display device 10_2 through the connector. The control circuit board 1600 may convert an image source input from the outside into digital video data DATA, and transmit the digital video data DATA to the first display device 10_1 and the second display device 10_2 through the connector.

The control circuit board 1600 may transmit digital video data DATA corresponding to a left eye image optimized for the user's left eye to the first display device 10_1 and transmit digital video data DATA corresponding to a right eye image optimized for the user's right eye to the second display device 10_2. In an alternative embodiment, the control circuit board 1600 may transmit the same digital video data DATA to the first display device 10_1 and the second display device 10_2.

The display device housing part 1100 serves to house the first display device 10_1, the second display device 10_2, the middle frame 1400, the first optical member 1510, the second optical member 1520, the control circuit board 1600, and the connector. The housing part cover 1200 is disposed to cover opened one surface of the display device housing part 1100. The housing part cover 1200 may include the first eyepiece 1210 on which the user's left eye is disposed and the second eyepiece 1220 on which the user's right eye is disposed. It has been illustrated in FIGS. 7 and 8 that the first eyepiece 1210 and the second eyepiece 1220 are separately disposed, but the disclosure is not limited thereto. The first eyepiece 1210 and the second eyepiece 1220 may be merged as one eyepiece.

The first eyepiece 1210 may be aligned with the first display device 10_1 and the first optical member 1510, and the second eyepiece 1220 may be aligned with the second display device 10_2 and the second optical member 1520. Accordingly, a user may view an image of the first display device 10_1 magnified as a virtual image by the first optical member 1510 through the first eyepiece 1210, and may view an image of the second display device 10_2 magnified as a virtual image by the second optical member 1520 through the second eyepiece 1220.

The head mounted band 1300 serves to fix the display device housing part 1100 to a user's head so that the first eyepiece 1210 and the second eyepiece 1220 of the housing part cover 1200 may be maintained in a state in which they are disposed on the user's left eye and right eye, respectively. When the display device housing part 1100 is implemented to have a light weight and a relatively small size, the HMD device 1000 may include an eyeglass frame as illustrated in FIG. 9 instead of the head mounted band 1300.

In addition, the HMD device 1000 may further include a battery for supplying power, an external memory slot for housing an external memory, and an external connection port and a wireless communication module for receiving an image source. The external connection port may be a universe serial bus ("USB") terminal, a display port, or a high-definition multimedia interface ("HDMI") terminal, and the wireless communication module may be a 5G communication module, a 4G communication module, a wireless fidelity ("WiFi") module, or a Bluetooth module.

Figure 9:
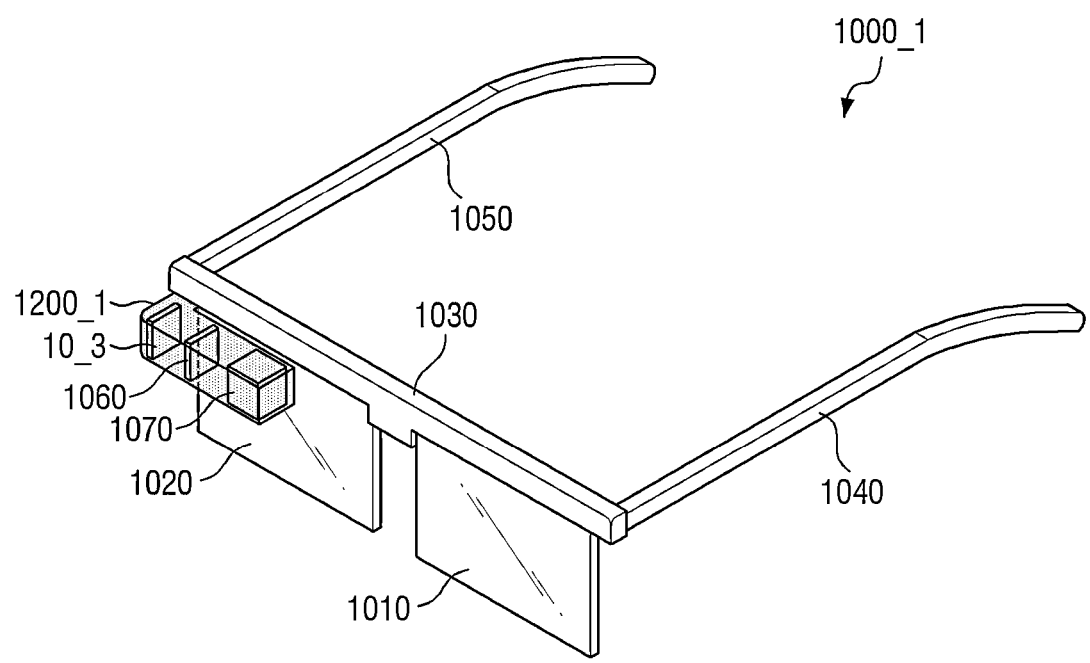
FIG. 9 is a perspective view illustrating another embodiment of an HMD device.

FIG. 9 is a perspective view illustrating another embodiment of an HMD device.

Referring to FIG. 9, an HMD device 1000_1 in another embodiment may be a glasses-type display device in which a display device housing part 1100_1 is implemented to have a light weight and a relatively small size. The HMD device 1000_1 in another embodiment may include a display device 10_3, a left eye lens 1010, a right eye lens 1020, a support frame 1030, glasses frame legs 1040 and 1050, an optical member 1060, an optical path conversion member 1070, and a display device housing part 1100_1.

The display device housing part 1100_1 may include the display device 10_3, the optical member 1060, and the optical path conversion member 1070. An image displayed on the display device 10_3 may be magnified by the optical member 1060, converted in an optical path by the optical path conversion member 1070, and provided to a user's right eye through the right eye lens 1020. For this reason, a user may view an augmented reality image in which a virtual image displayed on the display device 10_3 through his/her right eye and a real image seen through the right eye lens 1020 are combined with each other.

It has been illustrated in FIG. 9 that the display device housing part 1100_1 is disposed at a right end of the support frame 1030, but the disclosure is not limited thereto. In an embodiment, the display device housing part 1100_1 may be disposed at a left end of the support frame 1030, and in this case, an image of the display device 10_3 may be provided to a user's left eye, for example. In an alternative embodiment, the display device housing parts 12001 may be disposed at both the left and right ends of the support frame 1030, and in this case, the user may view an image displayed on the display device 10_3 through both his/her left and right eyes.

Figure 10:
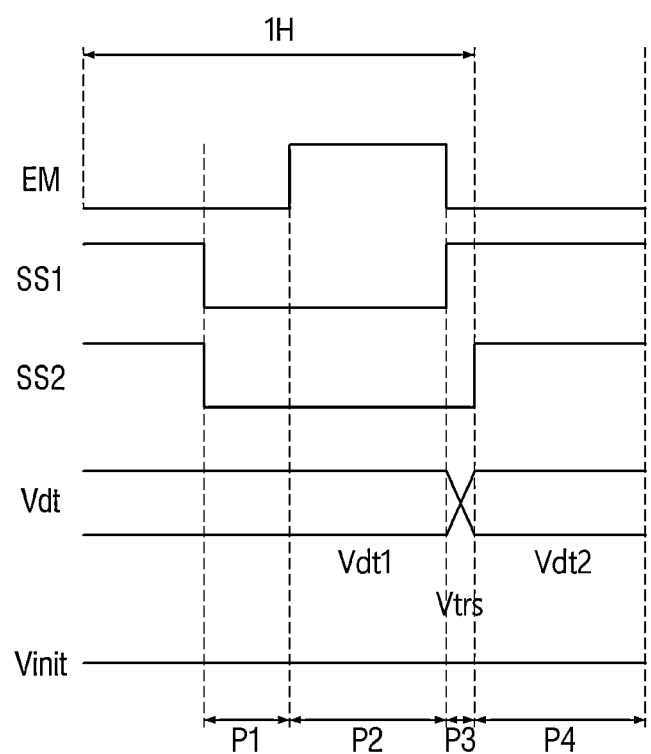
FIG. 10 is a timing chart of a first scan signal, a second scan signal, an emission control signal, and an initialization voltage of FIG. 4.

FIG. 10 is a timing chart of a first scan signal SS1, a second scan signal SS2, an emission control signal EM, and an initialization voltage Vint of FIG. 4.

The display device 10 may operate based on an initialization/write period P1, a compensation period P2, a bypass period P3, and an emission period P4 as in an example illustrated in FIG. 10.

The initialization/write period P1, the compensation period P2, the bypass period P3, and the emission period P4 may correspond to one horizontal period 1H. In other words, one horizontal period 1H may include the initialization/write period P1, the compensation period P2, the bypass period P3, and the emission period P4. Here, the horizontal period 1H may refer to a period during which pixels (e.g., pixels of one row) disposed along a horizontal direction (e.g., the first direction DR1) are driven. Here, the pixels of one row may refer to a plurality of pixels connected in common to a scan line (e.g., the first scan line SL1) and respectively connected to a plurality of different data lines DL.

The first scan signal SS1, the second scan signal SS2, and the emission control signal EM may each have an active level or a non-active level in each period. Here, the active level of each of the signals SS1, SS2, and EM may refer to a level of a voltage that may turn on a transistor to which the signal is applied. In other words, a signal of the active level may have a value higher than a threshold voltage of the corresponding transistor. In an embodiment, as illustrated in FIG. 4, when each of the transistors T1 to T4 is a P-type transistor, the active level of each of the signals SS1, SS2, and EM may refer to a relatively low level, for example. The non-active level of each of the signals SS1, SS2, and EM may refer to a level of a voltage that may turn off the corresponding transistor. In other words, a signal of the non-active level may have a value lower than the threshold voltage of the corresponding transistor. In an embodiment, as illustrated in FIG. 4, when each of the transistors T1 to T4 is a P-type transistor, the non-active level of each of the signals SS1, SS2, and EM may refer to a relatively high level, for example. When each of the transistors T1 to T4 is an N-type transistor, the active level of each of the signals SS1, SS2, and EM may refer to a relatively high level, and the non-active level of each of the signals SS1, SS2, and EM may refer to a relatively low level.

In the initialization/write period P1, the emission control signal EM, the first scan signal SS1, and the second scan signal SS2 may each have an active level. In addition, in such an initialization/write period P1, a data voltage Vdt may be applied to the data line DL. The data voltage Vdt may be a voltage having a predetermined gradation (or luminance) for displaying an image. In this case, the data voltage Vdt in such an initialization/write period P1 may be a data voltage Vdt1 (hereinafter referred to as a previous data voltage) of the previous horizontal period.

In the compensation period P2, the first scan signal SS1 and the second scan signal SS2 may each have an active level. In addition, in the compensation period P2, the previous data voltage Vdt1 may be applied to the data line DL.

In the bypass period P3, the emission control signal EM and the second scan signal SS2 may each have an active level, and the first scan signal SS1 may have a non-active level. In addition, in the bypass period P3, the data voltage Vdt of the data line DL may be a transient data voltage Vtrs changing (or transitioning) from the previous data voltage Vdt1 to a current data voltage Vdt2.

In the emission period P4, the emission control signal EM may have an active level, and the first scan signal SS1 and the second scan signal SS2 may each have a non-active level. In addition, in the emission period P4, the data voltage Vdt may be applied to the data line DL. The data voltage Vdt may be a voltage having a predetermined gradation (or luminance) for displaying an image. In this case, the data voltage Vdt in such an emission period P4 may be a data voltage Vdt2 (hereinafter referred to as a current data voltage) of a current horizontal period.

The initialization voltage Vint described above may be maintained at a constant level during all periods including the initialization/write period P1, the compensation period P2, the bypass period P3, and the emission period P4. In an embodiment, the initialization voltage Vint may be a direct current ("DC") voltage that always has a constant level regardless of the period, for example. Here, the initialization voltage Vint may be, e.g., a DC voltage higher than the common voltage ELVSS and lower than the driving voltage ELVDD.

An operation of the display device in an embodiment of the disclosure will be described with reference to FIGS. 10 to 14. In FIGS. 11 to 14, transistors surrounded by circles of a relatively thick line are transistor in a turn-on state, while transistors surrounded by dotted circles filled with a gray color are transistors in a turn-off state. In addition, arrows in FIGS. 11 to 14 indicate flows of currents.

First, an operation of the display device in an initialization/write period P1 will be described with reference to FIGS. 10 and 11.

Figure 11:
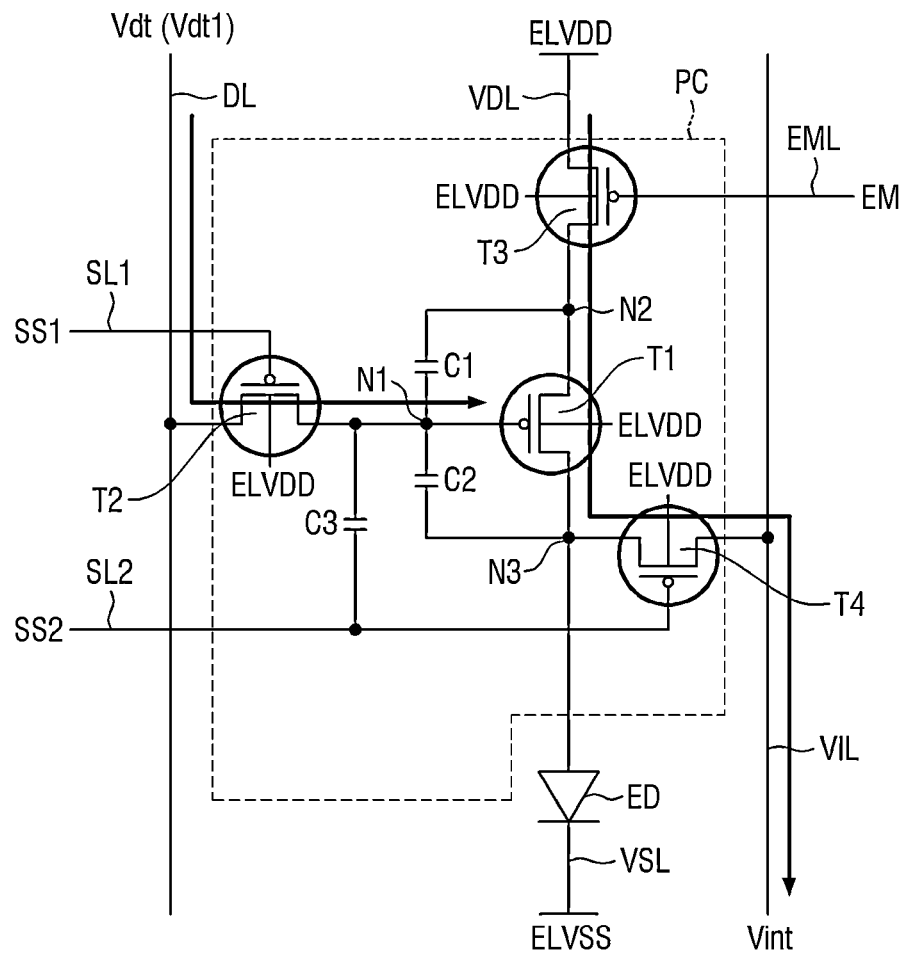
FIG. 11 is a diagram for describing an operation of the display device in an initialization/write period of FIG. 10.
Figure 11:
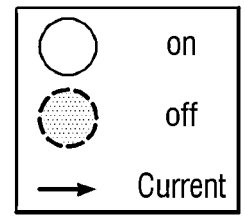

FIG. 11 is a diagram for describing an operation of the display device in an initialization/write period P1 of FIG. 10.

As illustrated in FIG. 10, in the initialization/write period P1, the emission control signal EM, the first scan signal SS1, and the second scan signal SS2 may each have the active level. In addition, in such an initialization/write period P1, the previous data voltage Vdt1 may be applied to the data line DL.

The first scan signal SS1 of the active level may be applied to the gate electrode of the second transistor T2 through the first scan line SL1. Accordingly, the second transistor T2 may be turned on.

The second scan signal SS2 of the active level may be applied to the gate electrode of the fourth transistor T4 through the second scan line SL2. Accordingly, the fourth transistor T4 may be turned on.

The emission control signal EM of the active level may be applied to the gate electrode of the third transistor T3 through the emission control line EML. Accordingly, the third transistor T3 may be turned on.

The first transistor T1 may be turned on by the previous data voltage Vdt1.

The above-described second transistor T2, third transistor T3, and fourth transistor T4 are turned on in the initialization/write period P1, and accordingly, the gate electrode of the first transistor T1 (e.g., the first node N1), the source electrode of the first transistor T1 (e.g., the second node N2), and the drain electrode of the first transistor T1 (e.g., the third node N3) may be initialized. In an embodiment, the previous data voltage Vdt1 from the data line DL may be applied to the first node N1, which is the gate electrode of the first transistor T1, through the turned-on second transistor T2, for example. In addition, the driving voltage ELVDD from the driving voltage line VDL may be applied to the second node N2, which is the source electrode of the first transistor T1, through the turned-on third transistor T3. In addition, the initialization voltage Vinit from the initialization voltage line VIL may be applied to the third node N3, which is the drain electrode of the first transistor T1, through the turned-on fourth transistor T4. Accordingly, respective voltages of the gate electrode of the first transistor T1, the source electrode of the first transistor T1, and the drain electrode of the first transistor T1 may be initialized. In an embodiment, the gate electrode of the first transistor T1 may be initialized to the previous data voltage Vdt1, the source electrode of the first transistor T1 may be initialized to the driving voltage ELVDD, and the drain electrode of the first transistor T1 (or an anode electrode of the light-emitting element ED) may be initialized to the initialization voltage Vinit, for example.

In addition, a current path may be formed between the driving voltage line VDL and the initialization voltage line VIL through the turned-on first transistor T1. The respective voltages of the source electrode and the drain electrode of the first transistor T1 described above may be initialized also by a current flowing along such a current path.

Next, an operation of the display device in a compensation period P2 will be described with reference to FIGS. 10 and 12.

Figure 12:
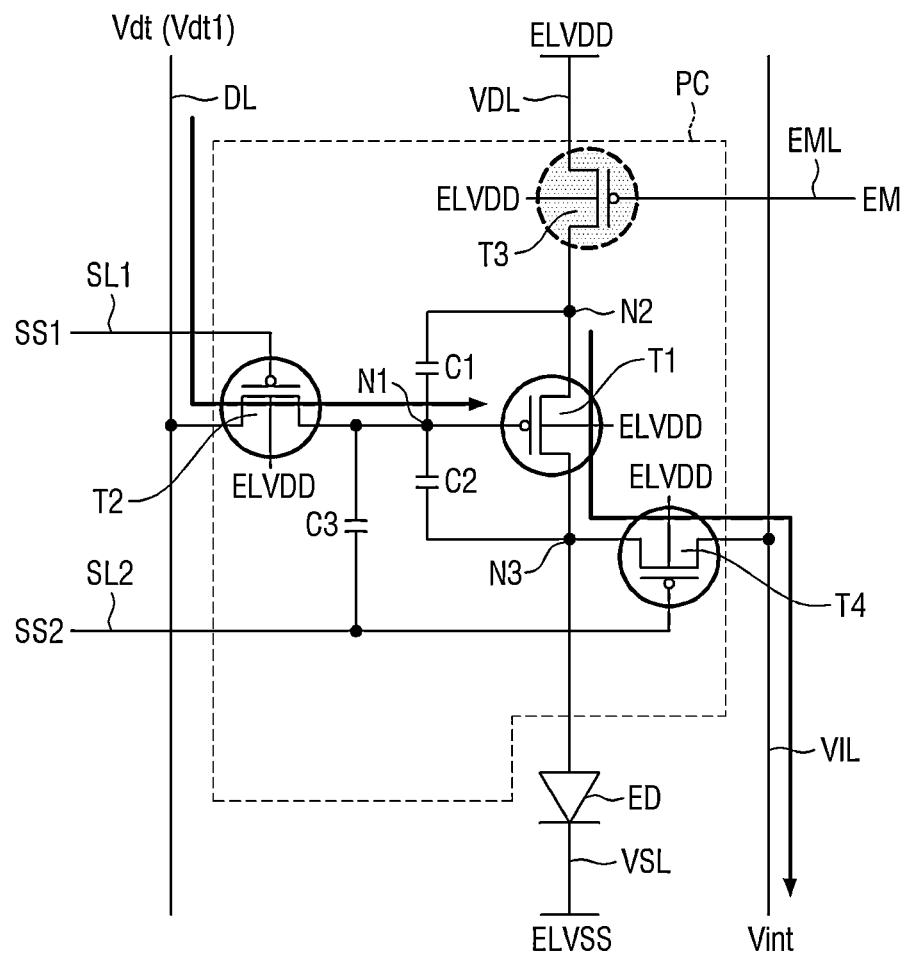
FIG. 12 is a diagram for describing an operation of the display device in a compensation period of FIG. 10.
Figure 12:
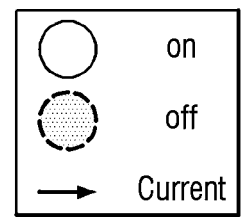

FIG. 12 is a diagram for describing an operation of the display device in a compensation period P2 of FIG. 10.

As illustrated in FIG. 10, in the compensation period P2, the first scan signal SS1 and the second scan signal SS2 may each have the active level, and the emission control signal EM may have the non-active level. In addition, in the compensation period P2, the previous data voltage Vdt1 may be applied to the data line DL.

The first scan signal SS1 of the active level may be applied to the gate electrode of the second transistor T2 through the first scan line SL1. Accordingly, the second transistor T2 may be turned on.

The second scan signal SS2 of the active level may be applied to the gate electrode of the fourth transistor T4 through the second scan line SL2. Accordingly, the fourth transistor T4 may be turned on.

The emission control signal EM of the non-active level may be applied to the gate electrode of the third transistor T3 through the emission control line EML. Accordingly, the third transistor T3 may be turned off.

The first transistor T1 may be turned on by the previous data voltage Vdt1.

In the compensation period P2, the threshold voltage of the first transistor T1 may be stored in the first capacitor C1. In an embodiment, the threshold voltage of the first transistor T1 may be stored in the first capacitor C1 in a source-follower manner, for example. In this case, a voltage of the second node N2 may be, e.g., a voltage obtained by subtracting the threshold voltage of the first transistor T1 described above from the previous data voltage Vdt1. In such a compensation period P2, the source electrode and the body electrode of the first transistor T1 are electrically connected to each other, and accordingly, a voltage between the body electrode and the source electrode (hereinafter referred to as a body-source voltage) of the first transistor T1 may be 0. As such, the body-source voltage of the first transistor T1 is 0 in the compensation period P2, and thus, ability to compensate for the threshold voltage Vth of the first transistor T1 in the compensation period P2 may be improved.

Next, an operation of the display device in a bypass period P3 will be described with reference to FIGS. 10 and 13.

Figure 13:
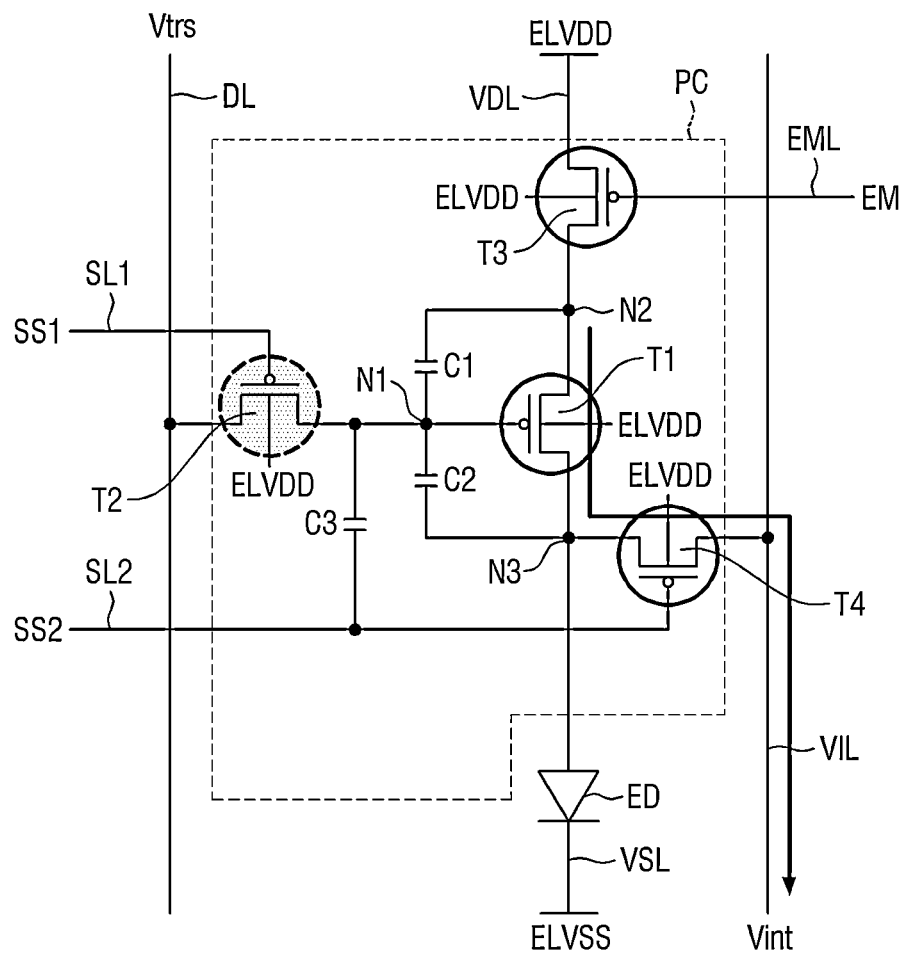
FIG. 13 is a diagram for describing an operation of the display device in a bypass period of FIG. 10.
Figure 13:
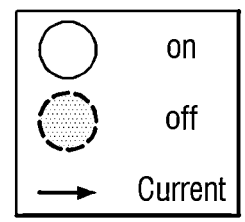

FIG. 13 is a diagram for describing an operation of the display device in a bypass period P3 of FIG. 10.

As illustrated in FIG. 10, in the bypass period P3, the emission control signal EM and the second scan signal SS2 may each have the active level, and the first scan signal SS1 may have the non-active level. In addition, in the bypass period P3, the data voltage Vdt of the data line DL may be the transient data voltage Vtrs changing (or transitioning) from the previous data voltage Vdt1 to the current data voltage Vdt2.

The first scan signal SS1 of the non-active level may be applied to the gate electrode of the second transistor T2 through the first scan line SL1. Accordingly, the second transistor T2 may be turned off.

The second scan signal SS2 of the active level may be applied to the gate electrode of the fourth transistor T4 through the second scan line SL2. Accordingly, the fourth transistor T4 may be turned on.

The emission control signal EM of the active level may be applied to the gate electrode of the third transistor T3 through the emission control line EML. Accordingly, the third transistor T3 may be turned on.

The first transistor T1 may be turned on by the previous data voltage Vdt1.

In the bypass period P3, the first scan signal SS1 changes (or transitions) from the active level to the non-active level, and accordingly, the second transistor T2 may be turned on for a short time. In this case, there may be a problem that an abnormal driving current generated by the transient data voltage Vtrs of the data line DL may be supplied to the light-emitting element ED. Therefore, in order to prevent such a problem, the fourth transistor T4 is turned on in such a bypass period P3 to prevent the abnormal driving current generated by the transient data voltage Vtrs from being applied to the light-emitting element ED. In an embodiment, the abnormal driving current generated by the transient data voltage Vtrs may be bypassed to the initialization voltage line VIL through the turned-on fourth transistor T4, for example.

Next, an operation of the display device in an emission period P4 will be described with reference to FIGS. 10 and 14.

Figure 14:
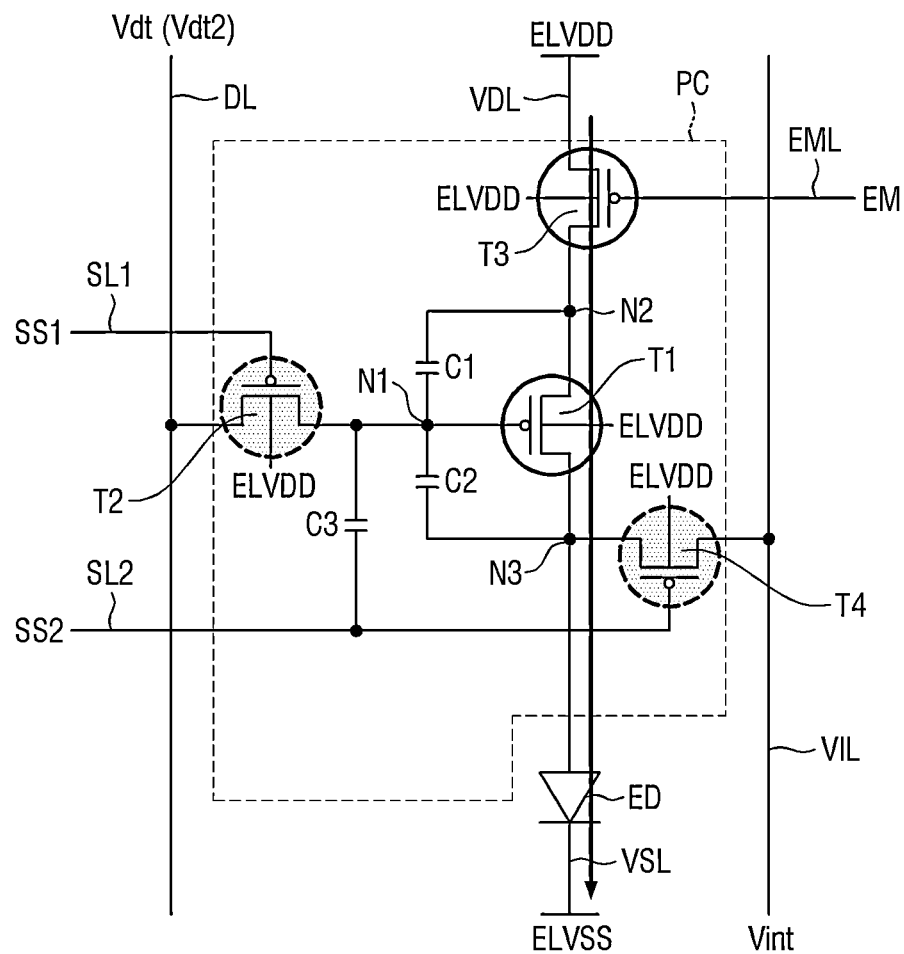
FIG. 14 is a diagram for describing an operation of the display device in an emission period of FIG. 10.
Figure 14:
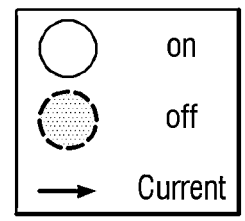

FIG. 14 is a diagram for describing an operation of the display device in an emission period P4 of FIG. 10.

As illustrated in FIG. 10, in the emission period P4, the emission control signal EM may have the active level, and the first scan signal SS1 and the second scan signal SS2 may each have the non-active level. In addition, in the emission period P4, the current data voltage Vdt2 may be applied to the data line DL.

The first scan signal SS1 of the non-active level may be applied to the gate electrode of the second transistor T2 through the first scan line SL1. Accordingly, the second transistor T2 may be turned off.

The second scan signal SS2 of the non-active level may be applied to the gate electrode of the fourth transistor T4 through the second scan line SL2. Accordingly, the fourth transistor T4 may be turned off.

The emission control signal EM of the active level may be applied to the gate electrode of the third transistor T3 through the emission control line EML. Accordingly, the third transistor T3 may be turned on.

The first transistor T1 may be turned on by the current data voltage Vdt2.

A current path from the driving voltage line VDL to the common voltage line VSL may be formed through the turned-on third transistor T3 and first transistor T1, and the driving current may flow through the current path. Such a driving current is supplied to the light-emitting element ED, and the light-emitting element ED may emit light by this driving current.

In an embodiment, even though an amount of change in voltage of the anode electrode (e.g., the third node N3) (hereinafter referred to as an anode voltage) (e.g., an amount of change in the anode voltage increasing in a positive polarity direction) occurs due to deterioration of the light-emitting element ED, the total capacitance of all capacitors is reduced by the third capacitor C3, and thus, an amount of change in the gate electrode of the first transistor T1 may be reduced. This will be described in detail with reference to the following Equations:

$$VG1' = (Cc1/(Cc1 + Cc2)) * \Delta VS + (Cc2/(Cc1 + Cc2)) * \Delta VA + VG1 \quad \text{(Equation 1)}$$

$$VG2' = VG2 + \Delta VA * (Cc1/(Cc1 + Cc2 + Cc3)) + (Cc3/(Cc1 + Cc2 + Cc3)) * \Delta VEB. \quad \text{(Equation 2)}$$

VG1' and VG1 in Equation 1 refer to a voltage of the gate electrode (hereinafter referred to as a gate voltage) of the first transistor T1 in a pixel that includes the first capacitor C1 and the second capacitor C2 (e.g., a pixel that does not include the third capacitor C3), VG1 is a gate voltage of the first transistor T1 in a state in which there is no change rate of the anode voltage, and VG1' is a gate voltage of the first transistor T1 in a state in which a change rate of the anode voltage is reflected.

In addition, VG2' and VG2 in Equation 2 refer to a voltage of the gate electrode (hereinafter referred to as a gate voltage) of the first transistor T1 in a pixel that includes the first capacitor C1, the second capacitor C2, and the third capacitor C3 (e.g., a pixel that further includes the third capacitor C3), VG2 is a gate voltage of the first transistor T1 in a state in which there is no change rate of the anode voltage, and VG2' is a gate voltage of the first transistor T1 in a state in which a change rate of the anode voltage is reflected.

In addition, in Equations 1 and 2, Cc1 may refer to a capacitance of the first capacitor C1, Cc2 may refer to a capacitance of the second capacitor C2, and Cc3 may refer to a capacitance of the third capacitor C3, ΔVS may refer to a change rate of a voltage of the source electrode (hereinafter referred to as a source voltage) of the first transistor T1, AVA may refer to a change rate of the anode voltage, and ΔVEB may refer to a change rate of a voltage of the second scan signal.

According to Equation 1 and Equation 2, a magnitude of VG1' may have a value of about 33% of a magnitude of Cc2/(Cc1+Cc2), and a magnitude of VG2' may have a value of about 12.5% of a magnitude of Cc2/(Cc1+Cc2+Cc3). In other words, the gate voltage of the first transistor T1 in the pixel that further includes the third capacitor C3 as in an embodiment is lower than the gate voltage of the first transistor T1 in the pixel that does not include the third capacitor C3. When the gate voltage of the first transistor T1 increases when the light-emitting element ED deteriorates, the driving current provided by the first transistor T1 may decrease. Accordingly, when the light-emitting element ED deteriorates, a luminance reduction amount of the pixel that includes the third capacitor C3 may be smaller than a luminance reduction amount of the pixel that does not includes the third capacitor C3. Therefore, even though the light-emitting element ED deteriorates, a luminance reduction rate of the display device in an embodiment that includes the third capacitor C3 is minimized, such that image quality may be improved.

It will be able to be understood by one of ordinary skill in the art to which the disclosure belongs that the disclosure may be implemented in other predetermined forms without changing the technical spirit or essential features of the disclosure. Therefore, it is to be understood that the embodiments described above are illustrative rather than being restrictive in all features. It is to be understood that the scope of the disclosure are defined by the claims rather than the detailed description described above and all modifications and alterations derived from the claims and their equivalents fall within the scope of the disclosure.

What is claimed is:

1. An electronic device comprising:
    a display device comprising:
        a light-emitting element;
        a first transistor connected between a driving voltage line and an anode electrode of the light-emitting element;
        a second transistor connected between a data line and a gate electrode of the first transistor;
        a third transistor connected between a source electrode of the first transistor and the driving voltage line;
        a fourth transistor connected between a drain electrode of the first transistor and an initialization voltage line;
        a first capacitor connected between the gate electrode of the first transistor and a gate electrode of the fourth transistor;
        a second capacitor connected between the gate electrode of the first transistor and the source electrode of the first transistor; and
        a third capacitor connected between the gate electrode of the first transistor and the drain electrode of the first transistor,
    wherein a capacitance of the first capacitor is greater than a capacitance of the third capacitor, and
    the capacitance of the third capacitor is greater than a capacitance of the second capacitor.

2. The electronic device of claim 1, wherein the capacitance of the third capacitor is 31.3% of the capacitance of the second capacitor, and
    the capacitance of the first capacitor is 18.8% of the capacitance of the second capacitor.

3. The electronic device of claim 1, further comprising:
    a first scan line connected to a gate electrode of the second transistor;
    an emission control line connected to a gate electrode of the third transistor; and
    a second scan line connected to the gate electrode of the fourth transistor.

4. The electronic device of claim 3, wherein in an initialization/write period, an emission control signal of the emission control line, a first scan signal of the first scan line, and a second scan signal of the second scan line each have an active level, in a compensation period, the first scan signal and the second scan signal each have an active level, in a bypass period, the emission control signal and the second scan signal each have an active level, and the first scan signal has a non-active level, and in an emission period, the emission control signal has an active level, and the first scan signal and the second scan signal each have a non-active level.

5. The electronic device of claim 4, wherein in the initialization/write period and the compensation period, a previous data voltage is applied to the data line, in the emission period, a current data voltage is applied to the data line, and in the bypass period, a transient data voltage which transitions from the previous data voltage to the current data voltage is applied to the data line.

6. The electronic device of claim 1, wherein at least one of the first transistor, the second transistor, the third transistor, and the fourth transistor includes a body electrode connected to the driving voltage line.

7. The electronic device of claim 1, wherein an initialization voltage of the initialization voltage line is lower than a driving voltage of the driving voltage line.

8. The electronic device of claim 1, further comprising a common voltage line connected to a cathode electrode of the light-emitting element.

9. The electronic device of claim 8, wherein an initialization voltage of the initialization voltage line is higher than a common voltage of the common voltage line.

10. A display device comprising:
a light-emitting element;
a first transistor connected between a driving voltage line and an anode electrode of the light-emitting element;
a second transistor connected between a data line and the gate electrode of the first transistor;
a third transistor connected between a source electrode of the first transistor and the driving voltage line;
a fourth transistor connected between a drain electrode of the first transistor and an initialization voltage line;
a first capacitor connected between a gate electrode of the first transistor and a gate electrode of the fourth transistor;
a second capacitor connected between the gate electrode of the first transistor and the source electrode of the first transistor;
a third capacitor connected between the gate electrode of the first transistor and the drain electrode of the first transistor, wherein a capacitance of the first capacitor is greater than a capacitance of the third capacitor, and the capacitance of the third capacitor is greater than a capacitance of the second capacitor.

11. The display device of claim 10, wherein the capacitance of the third capacitor is 31.3% of the capacitance of the second capacitor, and the capacitance of the first capacitor is 18.8% of the capacitance of the second capacitor.

12. The display device of claim 10, further comprising:
a first scan line connected to a gate electrode of the second transistor;
an emission control line connected to a gate electrode of the third transistor; and
a second scan line connected to the gate electrode of the fourth transistor.

13. The display device of claim 12, wherein in an initialization/write period, an emission control signal of the emission control line, a first scan signal of the first scan line, and a second scan signal of the second scan line each have an active level, in a compensation period, the first scan signal and the second scan signal each have an active level, in a bypass period, the emission control signal and the second scan signal each have an active level, and the first scan signal has a non-active level, and in an emission period, the emission control signal has an active level, and the first scan signal and the second scan signal each have a non-active level.

14. The display device of claim 13, wherein in the initialization/write period and the compensation period, a previous data voltage is applied to the data line, in the emission period, a current data voltage is applied to the data line, and in the bypass period, a transient data voltage which transitions from the previous data voltage to the current data voltage is applied to the data line.

15. The display device of claim 10, wherein at least one of the first transistor, the second transistor, the third transistor, and the fourth transistor includes a body electrode connected to the driving voltage line.

* * * * *